(12) United States Patent
Chida et al.

(10) Patent No.: US 7,782,430 B2
(45) Date of Patent: Aug. 24, 2010

(54) LIQUID CRYSTAL DISPLAY DEVICE TREATED BY UV IRRADIATION

(75) Inventors: Hideo Chida, Kawasaki (JP); Hidefumi Yoshida, Kawasaki (JP); Yasutoshi Tasaka, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 119 days.

(21) Appl. No.: 12/164,924

(22) Filed: Jun. 30, 2008

(65) Prior Publication Data

US 2008/0291388 A1    Nov. 27, 2008

Related U.S. Application Data

(60) Continuation of application No. 11/820,891, filed on Jun. 21, 2007, now Pat. No. 7,430,033, which is a continuation of application No. 11/450,754, filed on Jun. 9, 2006, now Pat. No. 7,251,001, which is a division of application No. 10/096,182, filed on Mar. 12, 2002, now Pat. No. 7,081,935.

(30) Foreign Application Priority Data

Aug. 1, 2001   (JP) ............................. 2001-233663

(51) Int. Cl.
  *G02F 1/1337*   (2006.01)
(52) U.S. Cl. ...................... 349/124; 349/123; 349/129; 349/135
(58) Field of Classification Search ............... 349/135
See application file for complete search history.

(56) References Cited

U.S. PATENT DOCUMENTS

| 5,607,732 | A | 3/1997 | Miyamoto et al. ......... 428/1.26 |
| 5,693,379 | A | 12/1997 | Sugimori et al. ........... 428/1.26 |
| 5,714,209 | A | 2/1998 | Asaoka et al. |
| 5,861,198 | A | 1/1999 | Yamaguchi et al. ........ 428/1.23 |
| 6,060,581 | A | 5/2000 | Yu et al. |
| 6,292,244 | B1 * | 9/2001 | Kuo et al. .................... 349/129 |
| 6,479,218 | B1 | 11/2002 | Choi .......................... 430/321 |
| 6,532,054 | B2 | 3/2003 | Ohmuro et al. ............. 349/143 |
| 6,583,837 | B1 | 6/2003 | Fukumoto et al. .......... 349/129 |
| 7,061,679 | B1 | 6/2006 | Yoon et al. ................... 359/485 |

FOREIGN PATENT DOCUMENTS

| JP | 55-121441 | 9/1980 |
| JP | 59-090930 | 5/1984 |

(Continued)

*Primary Examiner*—Richard H Kim
(74) *Attorney, Agent, or Firm*—Greer, Burns & Crain, Ltd.

(57) ABSTRACT

A liquid crystal display device includes a pair of substrates, a liquid crystal between substrates and alignment layers disposed on the inner surface sides of the substrates. The alignment layer is made from a material including polyamic acid containing a diamine component and polyimide containing a diamine component different from the diamine component of the polyamic acid. The alignment layer is subjected to alignment treatment by irradiation of light. UV light can be irradiated in the oblique direction onto the alignment layer through a mask having openings. A reflecting plate can be arranged between a UV light source and the mask. Also, bank structures having a thickness from 0.1 to 0.15 µm can be provided on the alignment layer of the TFT substrate.

6 Claims, 17 Drawing Sheets

FOREIGN PATENT DOCUMENTS

| | | |
|---|---|---|
| JP | A 64-4720 | 1/1989 |
| JP | 10-274776 | 10/1998 |
| JP | 11-202336 | 7/1999 |
| JP | 11-352489 | 12/1999 |
| JP | 2001-081323 | 3/2001 |
| JP | 2002-303870 | 10/2002 |

* cited by examiner

Fig.17

WIDTH AND ALIGNMENT STATE
OF NON-EXPOSED REGION

| WIDTH ($\mu$m) | ALIGNMENT |
|---|---|
| 0 | ○ |
| 10 | ○ |
| 20 | ○ |
| 30 | △ |
| 40< | × |

Fig.18

WIDTH AND ALIGNMENT STATE
OF OVERLAPPING EXPOSED REGION

| WIDTH ($\mu$m) | ALIGNMENT |
|---|---|
| 0 | ○ |
| 10 | ○ |
| 20 | ○ |
| 30 | × |
| 40< | × |

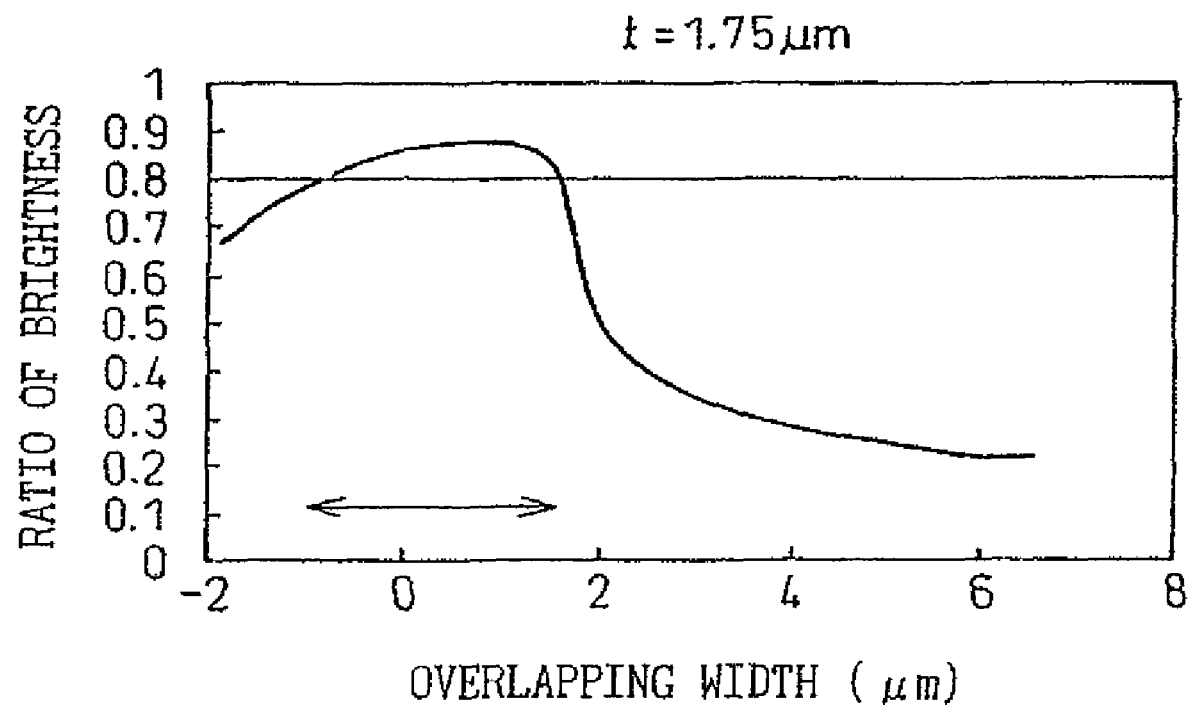

LIQUID CRYSTAL DISPLAY DEVICE TREATED BY UV IRRADIATION

This is a Continuation of application Ser. No. 11/820,891 filed Jun. 21, 2007, which is a Continuation of application Ser. No. 11/450,754 filed Jun. 9, 2006, now issued as U.S. Pat. No. 7,251,001, which is a Division of application Ser. No. 10/096,182, filed Mar. 12, 2002, now issued as U.S. Pat. No. 7,081,935.

BACKGROUND OF THE INVENTION

1. Field of the Invention

The present invention relates to a liquid display device in which light is irradiated onto an alignment layer or bank structures are provided, for controlling the alignment of the liquid crystal. The present invention also relates to an exposure apparatus of an alignment layer of a liquid crystal display device and a treatment method of an alignment layer.

2. Description of the Related Art

A liquid crystal display device includes a liquid crystal that is sandwiched between a pair of substrates, and an electrode for applying an electric field to the liquid crystal and an alignment layer for controlling the alignment of the liquid crystal are arranged on the inner surface side of each substrate. The alignment layer is treated for realizing the alignment of the liquid crystal molecules in a predetermined direction. Typically, the alignment layer is rubbed by a fiber material such as rayon, and the liquid crystal molecules are aligned in the rubbing direction. When the alignment layer is rubbed with the fiber material, however, the fiber material scatters, and the liquid crystal panel may be contaminated. Therefore, a technology that can control the alignment of the liquid crystal, without rubbing the alignment layer, has been required.

For example, Japanese Unexamined Patent Publication (Kokai) No. 11-202336 discloses a technology in which the alignment of the liquid crystal is controlled by obliquely irradiating the ultraviolet light onto the alignment layer. In the invention described in this publication, the ultraviolet light is obliquely irradiated onto the alignment layer through a mask having slits while the alignment layer is moved.

Japanese Unexamined Patent Publication (Kokai) No. 11-352489 discloses a technology in which the alignment of the liquid crystal is controlled by disposing bank structures (projection patterns) on the alignment layer. This technology uses a vertical alignment layer, and the liquid crystal molecules are aligned vertically to the alignment layer. At positions where the bank structure (projection pattern) exists, the liquid crystal molecules are aligned perpendicular to the side surface of the bank structure (projection pattern) and generally obliquely to the substrate surface. The bank structure (projection pattern) has side surfaces on either side thereof. The alignment direction of the liquid crystal molecules aligned vertically to one of the side surfaces of the bank structure (projection pattern) is opposite to the alignment direction of the liquid crystal molecules aligned vertically to the other side surface on the opposite side of the bank structure (projection pattern). In this way, alignment division is achieved.

Alignment division means that one pixel is divided into a plurality of regions having different alignments of the liquid crystal. In the case of rubbing, for example, the area of one pixel of the alignment layer is divided into two regions, the first region is rubbed in one direction and the second region is rubbed in the opposite direction. Thus, the liquid crystal molecules located in contact with the first region pretilt in one direction and the liquid crystal molecules located in contact with the second region pretilt in the opposite direction. It is known that viewing angle characteristics can be improved in the liquid crystal display device having such an alignment division.

Alignment division can be easily accomplished if a liquid crystal having negative dielectric anisotropy and an alignment layer having vertical alignment property are used.

When the ultraviolet light is obliquely irradiated onto the alignment layer having a vertical alignment property, alkyl side chains of the alignment layer existing in a plane perpendicular to the irradiation direction of the ultraviolet light absorb the ultraviolet light and are cut off, and alkyl side chains of the alignment layer existing in a plane parallel to the irradiation direction of the ultraviolet light do not absorb the ultraviolet light and remain as such. The liquid crystal molecules are thus aligned in accordance with the remaining alkyl side chains. To achieve alignment division, the ultraviolet light is irradiated obliquely onto one of the regions of the alignment layer in one oblique direction and is irradiated onto the other region of the alignment layer in the opposite oblique direction. In this case, a mask is arranged between the UV light source and the alignment layer so that the ultraviolet light can be irradiated selectively onto one region and the other region.

Various materials are used for the alignment layer. For example, Japanese Unexamined Patent Publication (Kokai) No. 64-004720 discloses a TN type liquid crystal display device using an alignment layer comprising a mixture of polyamic acid and polyimide. In this reference, however, the mixture of polyamic acid and polyimide constitutes a TN type liquid crystal cell.

Further, as the ultraviolet light is irradiated obliquely onto the alignment layer having a vertical alignment property, the liquid crystal is aligned in a direction parallel to the irradiation direction of the ultraviolet light used as the liquid crystal display device. On the other hand, an electrode is disposed with the alignment layer on each substrate. One of the substrates is a TFT substrate having a plurality of pixel electrodes and bus lines. The other substrate is a color filter substrate having a common electrode. The alignment treatment of the alignment layer is conducted in such a fashion that the alignment direction of the liquid crystal is parallel to the bus lines. In this case, a transverse electric field acts between the pixel electrode and the bus line, and a problem develops that this electric field disturbs the alignment of the liquid crystal at the boundary portion between the pixel electrode and the bus line.

In the case where the ultraviolet light is obliquely irradiated onto the alignment layer, the UV light source is disposed at a certain angle to the alignment layer. In the arrangement having such an angle, the distance (optical path length) between the UV light source and the alignment layer varies depending on the position of the alignment layer. Therefore, the intensity of the ultraviolet light irradiated onto the alignment layer varies and thus the tilt angle realized thereby may vary. In consequence, stable alignment cannot be achieved and excellent display cannot be provided as domains appear.

To accomplish alignment division in the alignment control technology using UV irradiation, an exposure apparatus including a UV light source and a mask is used. The mask is arranged between the UV light source and the alignment layer so that the ultraviolet light can be selectively irradiated onto portions of the alignment layer. In the first method of alignment division, the area of the opening of the mask is decreased so that the ultraviolet light having scattering property pass through the opening of the mask. However, this method involves the problem that utilization efficiency of the ultraviolet light is low and the irradiation time of the ultraviolet light must be elongated.

In the second alignment division method, the area of the opening of the mask is set to a size suitable for irradiating a half of the pixel, the UV light source is obliquely arranged relative to the mask and the ultraviolet light is irradiated onto a half of each pixel, and then the UV light source is oppositely obliquely arranged relative to the mask and the ultraviolet light is irradiated onto the remaining half of each pixel. In this case, however, positioning between the mask and the alignment layer becomes more difficult as the size of the pixels become smaller. Also, in a proximity exposure, a gap is provided between the mask and the alignment layer and their positioning is conducted. As the size of the pixels become smaller, however, the gap between the mask and the alignment layer must be decreased, but it is not possible to reduce the space below an allowable value.

SUMMARY OF THE INVENTION

It is an object of the present invention to provide a liquid display device capable of accomplishing stable alignment of a liquid crystal and therefore capable of acquiring excellent display.

It is another object of the present invention to provide an exposure apparatus of an alignment layer that can accomplish stable alignment of a liquid crystal with high utilization efficiency of ultraviolet light.

It is a further object of the present invention to provide a treatment method of an alignment layer by which positioning between a mask and an alignment layer can be easily conducted when an alignment treatment of the alignment layer is conducted by means of irradiation of ultraviolet light.

It is a still further object of the present invention to provide a liquid crystal display device in which the disturbance of the alignment of a liquid crystal due to a transverse electric field at a boundary portion between a pixel electrode and a bus line can be mitigated.

A liquid crystal display device, according to the present invention, comprises a pair of substrates, a liquid crystal arranged between the pair of substrates and an alignment layer disposed on the inner surface side of each of the substrates, wherein the alignment layer comprises a mixture of polyamic acid including a diamine component and polyimide including a diamine component different from the diamine component of the polyamic acid, and the alignment layer is treated for alignment of the liquid crystal by irradiation with ultraviolet light.

In this arrangement, polyamic acid has such a property that the achieved pretilt angle hardly changes as the irradiation quantity of the ultraviolet light changes, and polyimide has such a property that the achieved pretilt angle greatly changes as the irradiation quantity of the ultraviolet light changes. When they are mixed, the pretilt angle can be accomplished stably in accordance with the mixing ratio of polyimide and polyamic acid when a certain time is reached from the start of irradiation of the ultraviolet light, irrespective of the irradiation quantity of the ultraviolet light. However, if the diamine component used in polyamic acid is the same as the diamine component used in polyimide, polyamic acid and polyimide are likely to be uniformly mixed, the effect of polyimide to change the alignment state becomes small, and the property becomes analogous to that of polyamic acid. Therefore, the diamine component used in polyamic acid is preferably different from the diamine component used in polyimide.

An exposure apparatus of an alignment layer, according to the present invention, comprises a ultraviolet light source, a reflecting plate having slits allowing passage of ultraviolet light irradiated from the ultraviolet light source and a reflecting surface on the opposite side of the ultraviolet light source, and a photomask having openings allowing passage of the ultraviolet light outgoing from the slits of the reflecting plate and a reflecting surface on the side of the reflecting plate.

In this exposure apparatus, the utilization efficiency of the ultraviolet light becomes higher and stable alignment of the liquid crystal can be accomplished.

A method of treating an alignment layer by irradiating ultraviolet light onto an alignment layer having a plurality of pixel regions defined therein to treat the alignment layer for realizing alignment, according to the present invention, comprises the steps of arranging a photomask above the alignment layer; positioning the photomask with respect to the alignment layer so that a center portion of a first opening of the photomask is aligned with a center portion of a first pixel region of the alignment layer; arranging a ultraviolet light source above the photomask; wherein the ultraviolet light source, the photomask and the alignment layer are arranged such that the ultraviolet light passing through the first opening of the photomask impinges upon a pixel region of the alignment layer displaced from the first pixel region by n pixel regions (where n is an integer equal to or more than 0); wherein the ultraviolet light source, the photomask and the alignment layer are arranged to satisfy the following relationships (1) and (2), $$(g/2 - 20) \leq a \leq (g/2 + 20) \tag{1}$$

$$\frac{2d}{(4n+1)\tan\theta} - 20 \leq a \leq \frac{2d}{(4n+1)\tan\theta} + 20 \tag{2}$$

where "a" (μm) is a width of the opening of the photomask, "d" (μm) is a gap between the photomask and the alignment layer, θ (rad) is an angle of the ultraviolet light made incident to the alignment layer and "g" (μm) is a pitch of the pixel regions: and irradiating the ultraviolet light from the ultraviolet light source to treat the alignment layer for realizing alignment.

In this treating method, positioning between the mask and the alignment layer can be conducted, and the alignment treatment of the alignment layer can be securely carried out by the irradiation of the ultraviolet light.

A liquid crystal device, according to the present invention, comprises first and second substrates opposing each other; a liquid crystal arranged between the first and second substrates; a plurality of pixel electrodes, bus lines and an alignment layer disposed on the inner surface side of the first substrate; and a common electrode and an alignment layer disposed on the inner surface side of the second substrate; wherein the alignment layer of at least one of the first and second substrates is subjected to treatment for alignment of the liquid crystal in a predetermined direction, and bank structures having a thickness in the rage from 0.1 to 0.15 μm is disposed on the alignment layer of the second substrate at positions corresponding to the bus lines of the first substrate.

In this construction, the bank structures prevent the disturbance of alignment of a liquid crystal due to a transverse electric field at the boundary portion between the pixel electrode and the bus line.

BRIEF DESCRIPTION OF THE DRAWINGS

The present invention will become more apparent from the following description of the preferred embodiments, with reference to the accompanying drawings, in which:

FIG. 17 is a view showing the width of the non-exposed region and the alignment state of the liquid crystal display device with the alignment division established by exposing twice one pixel region;

FIG. 18 is a view showing the width of the overlapping exposure region and the alignment state of the liquid crystal display with the alignment division established by twice exposing one pixel region;

FIG. 30 is a view showing the relationship between the overlap of the bank structure with the pixel electrode and the ratio of brightness.

DESCRIPTION OF THE PREFERRED EMBODIMENTS

Figure 1:
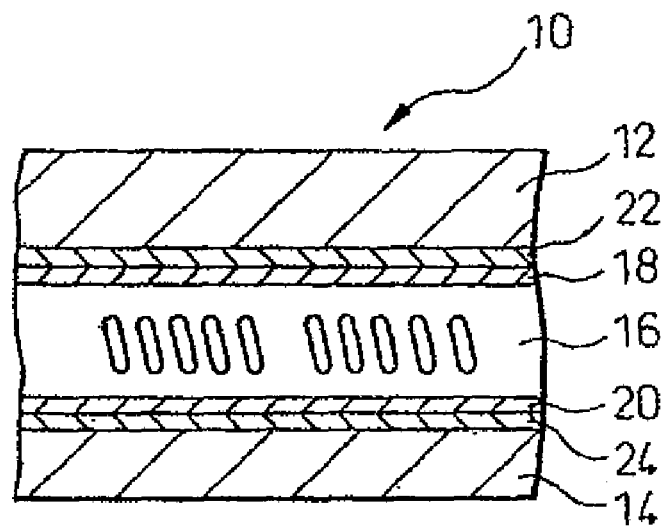
FIG. 1 is a view showing a liquid crystal display device according to the first embodiment of the present invention.

Preferred embodiments of the present invention will now be explained with reference to the drawings. FIG. 1 shows a liquid crystal display device according to the first embodiment of the present invention. The liquid crystal display device 10 includes a pair of transparent substrates 12 and 14, a liquid crystal 16 arranged between the pair of substrates 12 and 14, and alignment layers 18 and 20 respectively formed on the inner surface sides of the substrates 12 and 14. Electrodes 22 and 24 are disposed under the alignment layers 18 and 20, respectively. One of the electrodes is disposed with an active matrix including TFTs. The liquid crystal 16 has negative dielectric anisotropy, and the alignment layers 18 and 20 are vertical alignment layers. Therefore, the liquid crystal 16 is aligned substantially vertically, with a pretilt with respect to the substrates 12 and 14, as shown in FIG. 1.

In this embodiment, the alignment layers 18 and 20 are made of a material containing polyimide including a diamine component. Preferably, the alignment layers 18 and 20 are made of a mixture of polyamic acid including a diamine component and polyimide including a diamine component, the diamine component of polyamic acid being different from the diamine component of polyimide. The diamine component of polyimide further includes a diamine component that does not substantially contribute to vertical alignment and a diamine component that substantially contributes to vertical alignment, in which the proportion of the diamine component that substantially contributes to vertical alignment is equal to or more than 30% to the whole diamine component.

Figure 2:
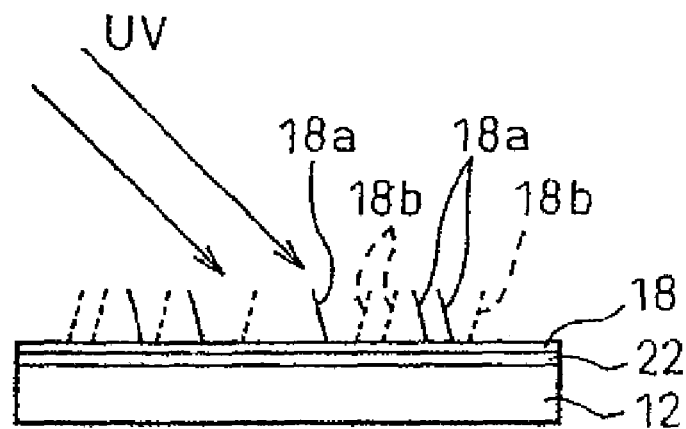
FIG. 2 is a view showing an example where ultraviolet light is irradiated onto the alignment layer shown in FIG. 1.

FIG. 2 shows an example where ultraviolet light is irradiated onto the alignment layer 18 (20). It is assumed that the diamine component of the alignment layer 18 (20) that substantially contributes to vertical alignment has alkyl side chains 18a and 18b shown with exaggeration. The alkyl side chains 18a and 18b protrude with respect to the surface of the alignment layer 18 (20) in various directions. The alkyl side chains 18a exist in planes substantially parallel to the direction of incidence of the ultraviolet light, and the alkyl side chains 18b exist in planes substantially perpendicular to the direction of incidence of the ultraviolet light. When nonpolarized or polarized ultraviolet light is irradiated obliquely onto the alignment layer 18 (20), the alkyl side chains 18b existing in planes substantially perpendicular to the irradiation direction of the ultraviolet light absorb the ultraviolet light and are cut off, but the alkyl side chains 18a existing in planes substantially parallel to the direction of incidence of the ultraviolet light do not absorb the ultraviolet light and are not cut off. Therefore, the alkyl side chains 18a remain uncut.

Figure 3:
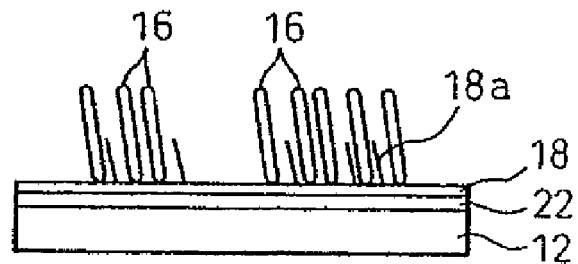
FIG. 3 is a view showing an example where liquid crystal molecules are aligned when the alignment layer shown in FIG. 2 is used.

FIG. 3 shows an example where the liquid crystal molecules are aligned when the alignment layer 18 (20) shown in FIG. 2 is used. The liquid crystal display device including the alignment layers 18 and 20 thus treated is assembled as shown in FIG. 1, and the liquid crystal 16 is inserted. The molecules of the liquid crystal 16 are thus pretilted in accordance with the alkyl side chains 18a that remain uncut. In consequence, the molecules of the liquid crystal 16 are aligned substantially vertically to the substrates 12 and 14 owing to vertical alignment property of the alignment layers 18 and 20 but are pretilted by a predetermined pretilt angle in accordance with the alkyl side chains 18a.

Figure 4:
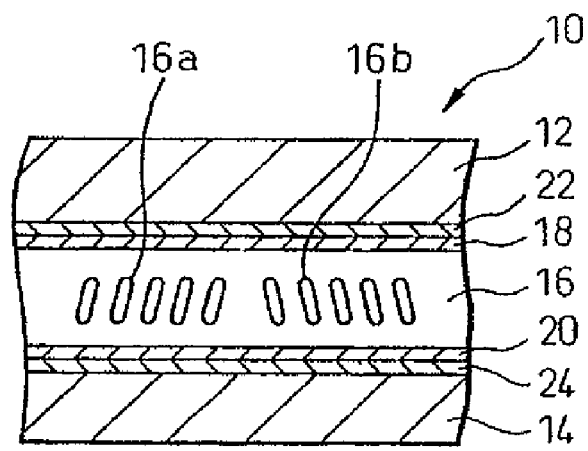
FIG. 4 is a view showing a modified example of the liquid crystal display device shown in FIG. 1.

FIG. 4 shows a modified example of the liquid crystal display device shown in FIG. 1. In FIG. 4, the liquid crystal 16 is aligned substantially vertically with pretilt to the substrates 12 and 14. However, the molecules 16a of the liquid crystal 16 in one region are aligned (pretilted) in a direction different from that of the molecules 16b of the liquid crystal 16 in another region. It is known that when a plurality of regions having different alignments exist in one pixel (when alignment division exists), the viewing angle characteristic of the liquid crystal display device can be improved.

Figure 5:
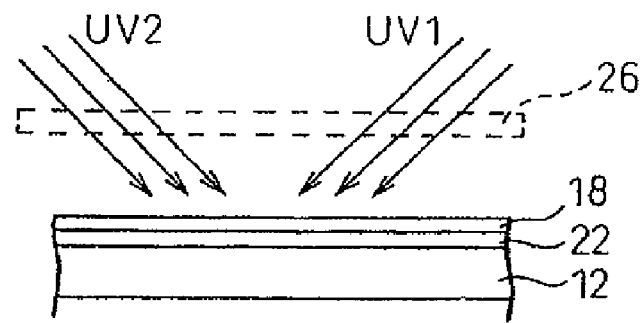
FIG. 5 is a view showing an example where ultraviolet light is irradiated onto the alignment layer shown in FIG. 4.

FIG. 5 shows an example where the ultraviolet light is irradiated onto the alignment layer 18 (20) shown in FIG. 4. In order to cause the molecules 16a of the liquid crystal 16 in one region to be aligned, the ultraviolet light UV1 is irradiated in one oblique direction. In order to cause the molecules 16b of the liquid crystal 16 in another region to be aligned, the ultraviolet light UV2 are irradiated in another oblique direction opposite to the oblique direction described above. A mask 26 is used when the ultraviolet light UV1 or UV2 is irradiated.

When the ultraviolet light is irradiated obliquely, the optical length between the UV irradiation source and the alignment layer 18 (20) varies depending on the position, and the intensity of the ultraviolet light irradiated varies depending on the position, with the result that the caused pretilt angle varies and stable alignment cannot be acquired, as described previously. The present invention solves this problem by constituting the material of the alignment layer 18 (20) as described above.

Figure 6:
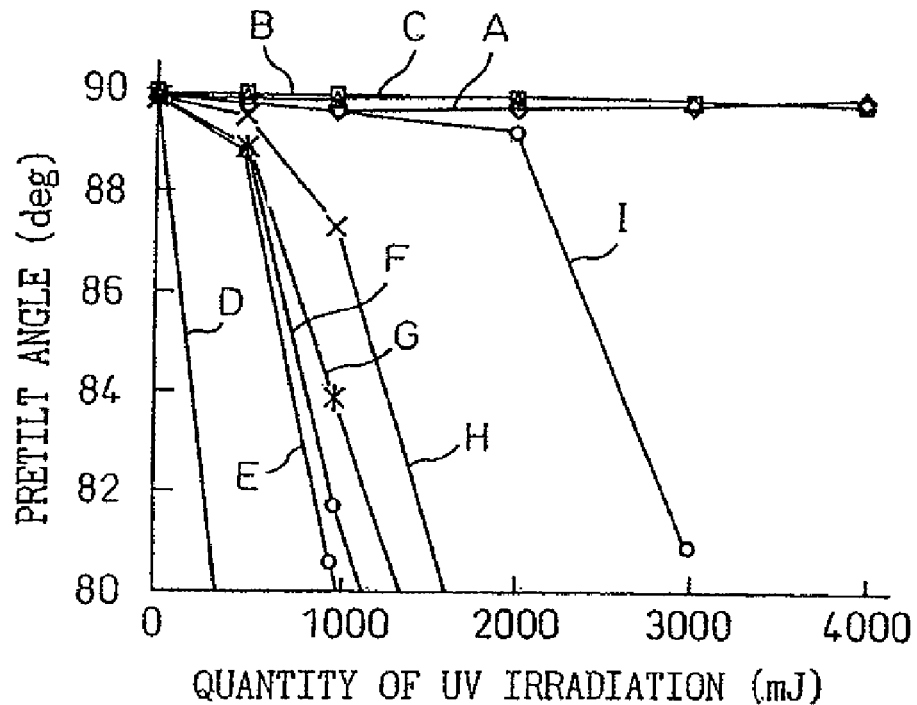
FIG. 6 is a view showing the relationship between the UV irradiation quantity and the pretilt angle when polyamic acid and polyimide are individually used to form an alignment layer.

FIG. 6 is a view showing the relationship between the irradiation quantity of the ultraviolet light and the pretilt angle when polyamic acid and polyimide are individually used for the alignment layers, respectively. Curves A, B and C represent the relationship between the irradiation quantity of the ultraviolet light and the pretilt angle, regarding polyamic acids A, B and C having mutually different contents of a diamine component contributing to vertical alignment, respectively. For the sake of convenience, the same symbol represents the kind of the resin and the curve corresponding to the former. When polyamic acid is individually used for the alignment layer, the caused pretilt angle hardly changes even when the content of the diamine component varies.

Curves D, E, F, G, H and I represent the relationship between the irradiation quantity of the ultraviolet light and the pretilt angle, regarding polyimide D, E, F, G, H and I having mutually different contents of a diamine component contributing to vertical alignment. For the sake of convenience, the same symbol represents the kind of the resin and the curve corresponding to the former. The proportions of the diamine component contributing to vertical alignment of polyimides D, E, F, G, H and I are 20, 40, 50, 60, 90 and 100%, respectively. When polyimide is individually used for the alignment layer, the pretilt angle achieved by UV irradiation greatly changes. However, when polyimide is individually used for the alignment layer, the pretilt angle changes very greatly when the irradiation quantity of the ultraviolet light changes.

Figure 7:
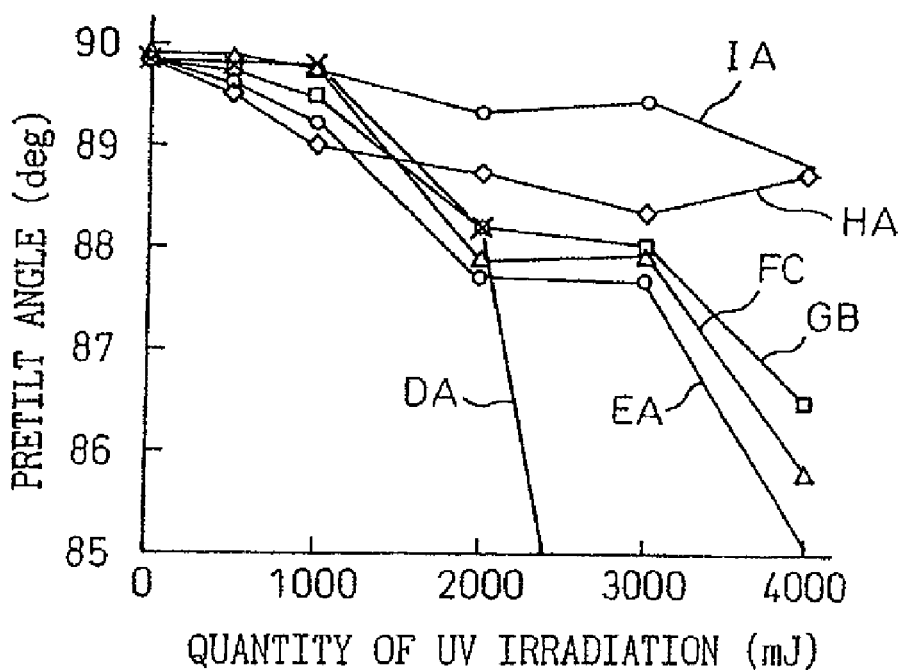
FIG. 7 is a view showing the relationship between the UV irradiation quantity and a pre-tilt angle when polyamic acid and polyimide are mixed and used to form the alignment layer.

FIG. 7 is a view showing the relationship between the irradiation quantity of the ultraviolet light and the pretilt angle when the polyamic acid and polyimide are mixed and used for the alignment layers, respectively. For the sake of convenience, the same symbol represents the kind of the resin and the curve corresponding to the former. Curves DA, EA, FC, GB, HA and IA represent the alignment layers prepared by mixing polyamic acids A, B, C and polyimides D, E, F, G, H and I described above, respectively. In the curve DA representing the mixture containing polyimide having a small content (20%) of the diamine component contributing to vertical alignment, the pretilt angle greatly varies as the irradiation quantity of the ultraviolet light varies. In the curve IA representing the mixture containing polyimide having a large content (90 or 100%) of the diamine component contributing to vertical alignment, the change of the pretilt angle is relatively small even when the irradiation quantity of the ultraviolet light becomes great. In the curves EA, FC, GB and HA representing the mixture containing polyimide having a suitable content (equal to or more than 30%) of the diamine component contributing to vertical alignment, the change of the caused pretilt angle is very small as the irradiation quantity of the ultraviolet light varies.

In summary, polyamic acid has such a property that the achieved change in the pretilt angle is very small even when the irradiation quantity of the ultraviolet light is large whereas polyimide has such a property that the pretilt angle varies relatively greatly when the irradiation quantity of the ultraviolet light becomes larger. When these resins are mixed, the characteristics of polyimide and the characteristics of polyamic acid are averaged, and a pretilt angle corresponding to the mixing ratio of polyamic acid and polyimide is kept stable, after a certain time elapses from the start of irradiation of the ultraviolet light, without depending on the UV irradiation quantity. In other words, in the region of the UV irradiation quantity within 2,000 to 3,000 mJ, the pretilt angle hardly varies in the curves EA, FC, GB and HA even when the UV irradiation quantity varies. Therefore, when the quantity of the ultraviolet light actually irradiated changes, the pretilt angle remains substantially constant.

However, if the diamine component used for polyamic acid is the same as the diamine component used for polyimide, polyamic acid and polyamide become miscible more uniformly and the effect of changing the alignment state of polyimide becomes smaller, and its property becomes closer to that of polyamic acid. For this reason, the diamine component used for polyamic acid is preferably different from the diamine component used for polyimide.

Also, there are diamines which can realize a vertical alignment property and others which do not realize a vertical alignment property. When the amount of diamine realizing a vertical alignment property is too small, the change of the pretilt upon irradiation of the ultraviolet light becomes too great, and pretilt control becomes difficult when polyimide including such diamine is mixed with polyamic acid. Therefore, the proportion of the diamine component having vertical alignment property to the whole diamine components is preferably equal to or more than 30%. More preferably, the proportion of the diamine component having vertical alignment property to the whole diamine components is equal to or more than 40% and equal to or less than 90%.

Figure 8:
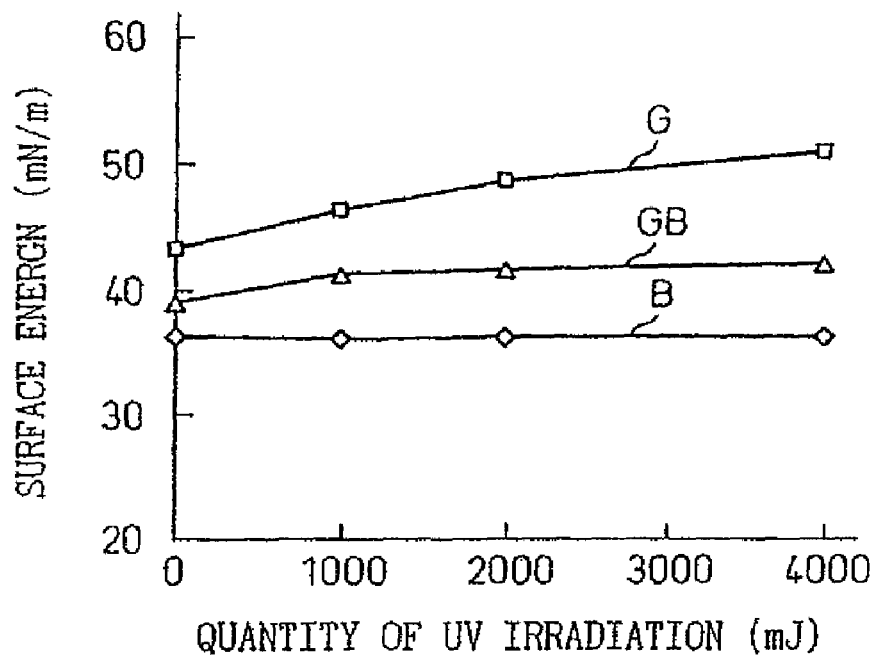
FIG. 8 is a view showing the relationship between the UV irradiation quantity and the surface energy of the alignment layer, when two kinds of resins are individually applied to the substrate and when they are mixed and applied.

FIG. 8 is a view showing the relationship between the irradiation quantity of the ultraviolet light and the surface energy of the alignment layer, when two kinds of resins are individually applied to the alignment layer and when their mixture is applied, respectively. Curve B relates to polyamic acid similar to polyamic acid B described above. Curve G relates to polyimide G similar to polyimide G described above, Curve GB relates to the mixture of polyamic acid B and polyimide G. When the resin whose surface energy hardly changes upon irradiation of the ultraviolet light and the resin whose surface energy greatly changes are mixed together, a region appears in which the surface energy hardly varies at a certain irradiation quantity, in the same way as in the case of the pretilt angle shown in FIGS. 6 and 7. In this way, a stable pretilt can be obtained.

If the resins have mutually different surface energy values, non-uniformity occurs advantageously to a certain extent when the resins are mixed, for the same reason as in the case where the diamine components are different. Therefore, the mixture preferably comprises resins having surface energy values that are different from each other by a value equal to or more than 2 mN/m on the surface of the alignment layers 18 and 20 formed on the substrates 12 and 14, respectively.

Mixing of the resins having different surface energy values change quantities to the ultraviolet light corresponds to mixing of the resins having different pretilt angles in the same way as when polyamic acid and polyimide are mixed. Therefore, it is preferred to form the alignment layers 18 and 20 on the substrates 12 and 14 by mixing at least two kinds of resins having different surface energy values change quantities to the ultraviolet light.

Figure 9:
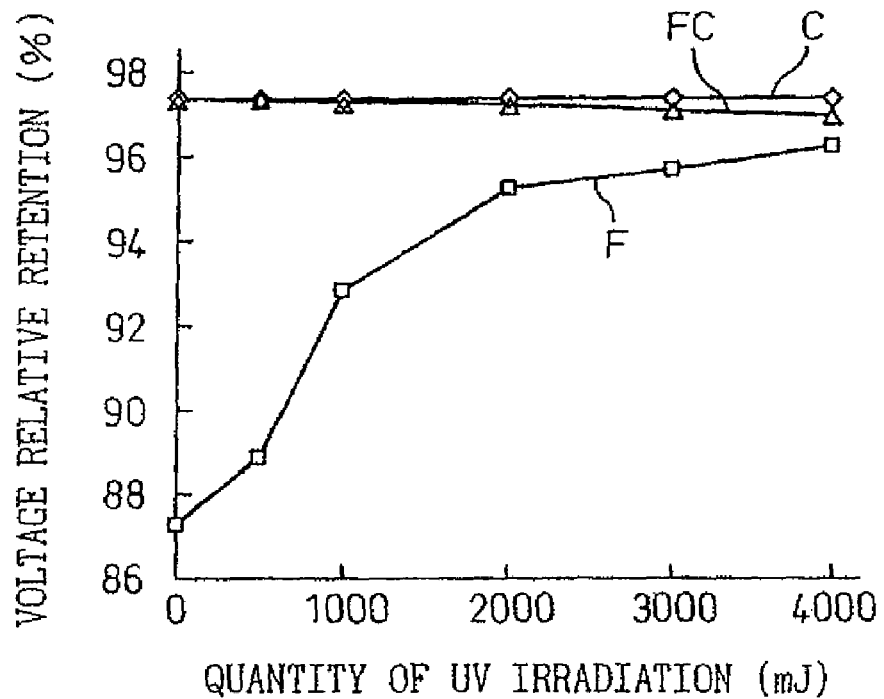
FIG. 9 is a view showing the relationship between the UV irradiation quantity and the voltage relative retention of the alignment layer, when two kinds of resins are individually applied to the substrate and when they are mixed and applied.

FIG. 9 is a view showing the relationship between the voltage relative retention and the irradiation quantity of the ultraviolet light of the alignment layer, when two kinds of resins are individually applied to the substrate and when their mixture is applied. Curve C relates to polyamic acid C similar to the polyamic acid C described above. Curve F relates to polyimide F similar to the polyimide F described above. Curve FC relates to the mixture of polyimide F and polyamic acid C. The alignment layer of curve C has such a property that the voltage relative retention drops due to the ultraviolet light irradiation, whereas the alignment film of curve F has such a property that the voltage relative retention rises due to the ultraviolet light irradiation. When both resins are mixed (curve FC), the drop in the voltage relative to retention can be eventually suppressed. Therefore, an excellent voltage relative retention can be acquired even when the ultraviolet light is irradiated.

It is therefore preferred to form the alignment layers 18 and 20 on the substrates 12 and 14 by mixing at least two kinds of resins the voltage relative retentions of which, with respect to the ultraviolet light, are different from each other.

Concrete examples will be explained below.

Example 1

Alignment layers 18 and 20 are prepared from a mixture of polyamic acid A and polyimide H (having a 90% content of diamine component contributing to vertical alignment). The mixing ratio is polyamic acid A:polyimide H=49:1. The alignment layer material containing this mixture is applied by using a spinner and is baked to form the alignment layers 18 and 20 on the substrates 12 and 14. Ultraviolet light is irradiated onto the alignment layers 18 and 20 in the oblique direction. Incidentally, several samples are prepared by changing the irradiation quantity of the ultraviolet light. A thermosetting sealant is applied to one of the substrates and spacers of 4 μm are scattered on the other substrate, and both substrates are then joined. After vacuum packing, thermosetting is conducted to form an empty cell. A liquid crystal having negative dielectric anisotropy is charged into this empty cell in vacuum environment to form a liquid crystal display panel. A pretilt angle of the liquid crystal display panel thus fabricated is measured. As represented by curve HA in FIG. 7, the pretilt angle attains minimum at the irradiation quantity 3 J of the ultraviolet light, and the change of the pretilt angle is very small before and after (near) this minimum value. In this way, a stable pretilt angle can be obtained.

Example 2

The alignment layers 18 and 20 are prepared from a mixture of polyamic acid B having a surface energy change shown in FIG. 8 and polyimide G (having a 60% content of a diamine component contributing to vertical alignment), The mixing ratio is polyamic acid B:polyimide G=4:1. An alignment layer material containing this mixture is used to produce a liquid crystal display panel in the same way as in Example 1. A pretilt angle of the liquid crystal panel thus produced is measured. As represented by curve GB in FIG. 7, the pretilt angle attains minimum at an irradiation quantity 3 J of the ultraviolet light, and the change of the pretilt angle is considerably small before and after this minimum value. In this way, a stable pretilt angle can be obtained. Surface energy hardly changes, either, as shown in FIG. 8.

Example 3

Alignment layers 18 and 20 are prepared from a mixture of polyamic acid, C having a surface energy change shown in FIG. 9 and polyimide F (having a 50% content of a diamine component contributing to vertical alignment). The mixing ratio is polyamic acid C:polyimde F=3:1. An alignment layer material containing this mixture is used to produce a liquid crystal display panel in the same way as in Example 1. A pretilt angle of the liquid crystal panel thus produced is measured. As represented by curve FC in FIG. 7, the pretilt angle attains about 88° at an irradiation quantity of 2 J to 3 J of the ultraviolet light, and the change of the pretilt angle hardly exists. In this way, a stable pretilt angle can be obtained. As shown in FIG. 8, the change of the voltage relative retention is small, and an excellent voltage relative retention can be acquired.

Comparative Example

Alignment layers 18 and 20 are prepared from a mixture of polyamic acid A and polyimide D (having a 20% content of a diamine component contributing to vertical alignment). The mixing ratio is polyamic acid A:polyimide D=49:1. An alignment layer material containing this mixture is used to produce a liquid crystal display panel in the same way as in Example 1. A pretilt angle of the liquid crystal panel thus produced is measured. As represented by curve DA in FIG. 7, the pretilt angle attained drastically drops with the increase of the irradiation quantity of the ultraviolet light, and a stable pretilt angle cannot be acquired.

Figure 10:
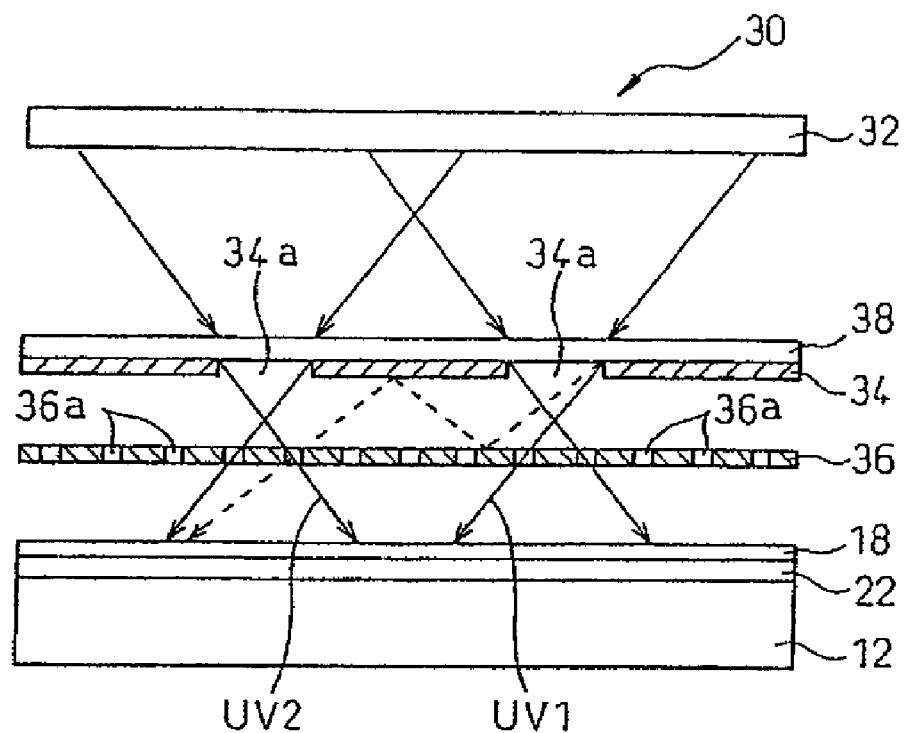
FIG. 10 is a view showing an exposure apparatus of an alignment layer according to the second embodiment of the present invention.

FIG. 10 shows an exposure apparatus of an alignment layer according to the second embodiment of the present invention. The exposure apparatus 30 of the alignment layer is adapted for the exposure treatment onto the alignment layer 18 (20) of the liquid crystal display device 10 shown in FIG. 4, for example. The exposure apparatus 30 includes a UV light source 32, a reflecting plate 34 having slits 34a allowing passage of the ultraviolet light, and a photomask 36 having openings 36a allowing the ultraviolet light passing through the slits 34a of the reflecting plate 34 to directly pass therethrough and the ultraviolet light reflected by the surface of the reflecting plate 34 on the opposite side of the UV light source 32 after passing through the slits 34a of the reflecting plate 34 to pass therethrough.

The slits 34a of the reflecting plate 34 and the openings 36a of the photomask 36 extend in a stripe form in the direction perpendicular to the sheet of FIG. 10. The slits 34a of the reflecting plate 34 have a width of about 5 mm, for example, The openings 36a of the photomask 36 have a width of about 20 μm, for example. The openings 36a are arranged in the pitch of 220 μm. The gap between the reflecting plate 34 and the photomask is 1 cm, and the gap between the photomask 36 and the alignment layer 18 (20) is 100 μm.

In this embodiment, the reflecting plate 34 is attached to a transparent scattering plate 38. A mask used in a prior art exposure apparatus is made of chromium or the like. Chromium has a low reflection factor. The reflecting plate 34 and the photomask 36 in this invention are made of a material having a high reflection factor in the wavelength region of the ultraviolet light. For example, the reflecting plate 34 and the photomask 36 are made of aluminum or aluminum coated with a fluorine compound. Alternatively, the reflecting plate 34 and the photomask 36 are made of a multi-layered dielectric film.

The UV light source 32 mainly emits the ultraviolet light within the range of 220 to 260 nm. The ultraviolet light within this wavelength range is suitable for cutting off the alkyl side chains of the alignment layer when irradiated, and can conduct an excellent alignment treatment of an alignment layer. Since the ultraviolet light in this range can be distinguished from indoor light, it is easy to handle. Aluminum has a reflection factor of about 90% to the ultraviolet light within the range of 220 to 260 nm, and is therefore suitable as a material having a high reflection factor for the ultraviolet light.

The surface of aluminum is oxidized during use, and the oxide protects aluminum but invites a drop in the reflection factor to the ultraviolet light. Therefore, the drop of the reflection factor to the ultraviolet light can be prevented and the reflection factor can be increased if aluminum, the surface of which is coated with a fluorine compound, is used. Examples of such a fluorine compound include magnesium fluoride and calcium fluoride. Examples of the multi-layered dielectric film include $SiO_2/MgF_2$ and $LaF_3/MgF_2$. The multi-layered dielectric film is produced by alternately laminating two materials having mutually different refractive indices in a thickness of a ¼ wavelength to dozens of layers, and its reflection factor is about 95%.

The surface of the reflecting plate 34 on the side of the photomask 36 and the surface of the photomask 36 on the side of the reflecting plate 34 serve as the reflecting surfaces. The UV light source 32 emits scattering light. Therefore, as represented by solid lines with arrows, the ultraviolet light emitted from the UV light source 32 passes through the slits 34a of the reflecting plate 34 and then through the openings 36a of the photomask 36, and impinges upon the alignment layer 18 (20). Further, as represented by broken lines with arrows, the ultraviolet light emitted from the UV light source 32 passes through the slits 34a of the reflecting plate 34, is reflected by the photomask 36 and then by the reflecting plate 34, passes then through the openings 36a of the photomask 36, and impinges upon the alignment layer 18 (20).

In this way, the ultraviolet light outgoing from the slits 34a of the reflecting plate 34 directly irradiates the alignment layer 18 (20). In addition, the ultraviolet light outgoing from the slits 34a of the reflecting plate 34 and reflected by the photomask 36 and by the reflecting plate 34 passes through the openings 36a of the photomask 36 and irradiates the alignment layer 18 (20). Therefore, in comparison with the case where the reflecting plate 34 does not exist, the quantity of the ultraviolet light passing through the openings 36a of the photomask 36 increases, and it becomes possible to acquire the alignment layer 18 (20) having high utilization efficiency of the ultraviolet light and capable of achieving stable alignment of the liquid crystal. As the scattering plate 38 is disposed, the ultraviolet light transmitting through the interior of the scattering plate 38 outgoes from the slits 34a of the reflecting plate 34, and utilization efficiency of the ultraviolet light can be further improved.

The UV light source 32 emits scattering light. The ultraviolet light passing through the openings 36a of the photomask 36 mainly obliquely irradiates the alignment layer 18 (20). The ultraviolet light (UV1) traveling obliquely in one direction strikes a part of the region of the alignment layer 18 (20). The ultraviolet light (UV2) traveling obliquely in the opposite direction strikes another part of the region of the alignment layer 18 (20). The function of the alignment treatment of the alignment layer 18 (20), by obliquely irradiating the alignment layer 18 (20) with the ultraviolet light, has already been explained with reference to FIGS. 2 and 3. The function of achieving alignment division by the ultraviolet light (UV1) traveling obliquely in one direction and the ultraviolet light (UV2) traveling obliquely in the other direction has already been explained with reference to FIGS. 4 and 5. This embodiment can accomplish alignment division by a single alignment treatment.

Figure 11:
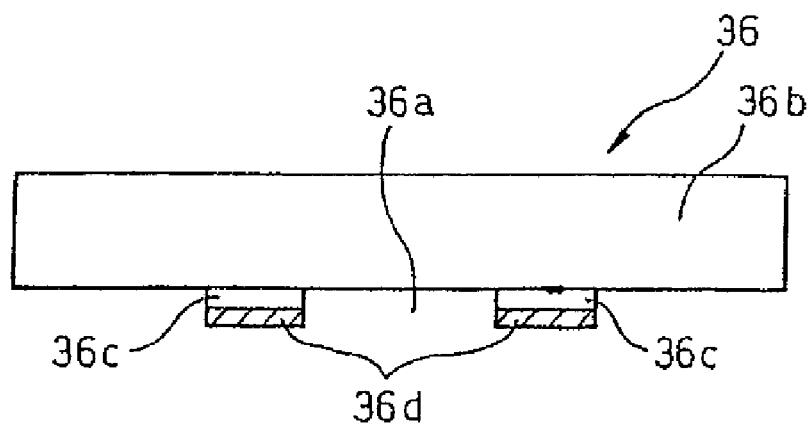
FIG. 11 is a view showing in detail the photomask shown in FIG. 10.

FIG. 11 shows in detail the photomask 36. The photomask 36 is fabricated by forming a two-layered structure of a material layer (aluminum) 36c having a high UV reflection factor and a material layer (titanium oxide) 36d absorbing the ultraviolet light on a transparent substrate 36b. The material layer 36c having a high UV reflection factor reflects the ultraviolet light outgoing from the slits 34a of the reflecting plate 34 and allows the ultraviolet light reflected by the reflecting plate 34 to pass through the openings 36a. The material layer 36d absorbing the ultraviolet light is disposed on the side of the alignment layer 18 (20) to be irradiated, and absorbs the ultraviolet light reflected by the alignment layer 18 (20). In this way, the ultraviolet light reflected by the alignment layer 18 (20) can be prevented from being incident as stray light into the alignment layer 18 (20).

A thermosetting sealant (a product of Mitsui Chemical Co.) is applied to one of the substrates 12 and 14 having alignment layers (a product of JSR K. K.) 18 and 20 formed by using the exposure apparatus 30 shown in FIGS. 10 and 11, and spacers of 4 μm diameter (a product of Sekisui Fine Chemical Co.) are scattered on the other substrate. Both substrates are then joined to each other. After packed in vacuum, the substrates are maintained in an oven at 135° C. for 90 minutes to fabricate an empty cell. The vertical alignment layer 16 (a product of Merck Co.) having negative dielectric anisotropy is charged into this empty cell to fabricate a liquid crystal display panel.

Figure 12:
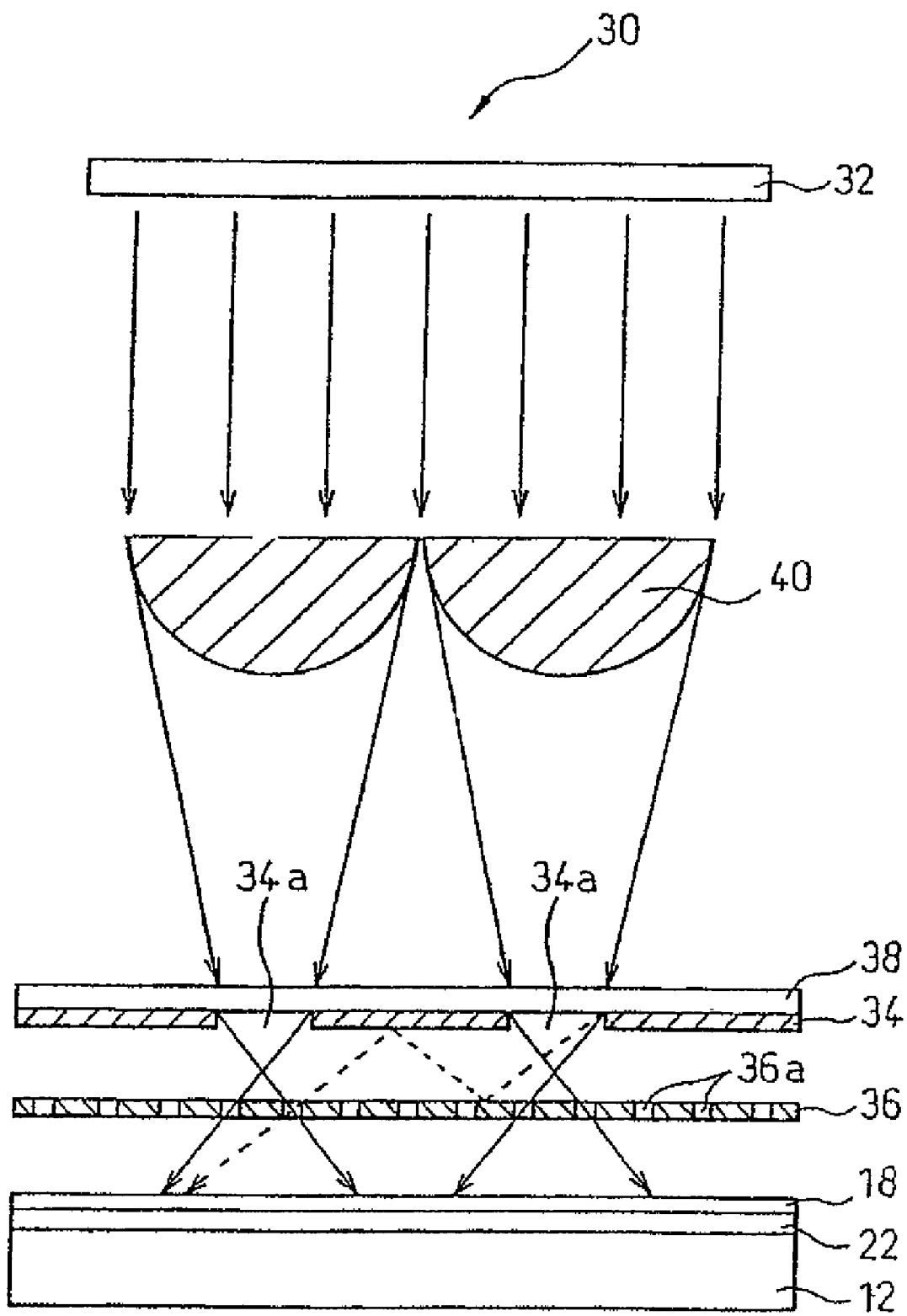
FIG. 12 is a view showing a modified example of the exposure apparatus of the alignment layer shown in FIG. 10.

FIG. 12 shows a modified example of the exposure apparatus of the alignment layer shown in FIG. 10. In the same way as in the example shown in FIG. 11, the exposure apparatus 30 of the alignment layer includes a UV light source 32, a reflecting plate 34 having slits 34a allowing passage of the ultraviolet light and a photomask 36 having openings 36a allowing passage of the ultraviolet light outgoing from the slits 34a of the reflecting plate 34 and the ultraviolet light reflected by the surface of the reflecting plate 34 on the opposite side of the UV light source 32. The reflecting plate 34 is attached to a transparent scattering plate 38.

In FIG. 12, the UV light source 32 emits parallel ultraviolet light. Condensing means 40 comprising convex lenses is interposed between the UV light source 32 and the reflecting plate 34. The condensing means 40 condenses the ultraviolet light emitted from the UV light source 32 to the slits 34a of the reflecting plate 34, and the ultraviolet light so condensed passes through the slits 34a of the reflecting plate 34. The light transmitting through the scattering plate 38 passes through the slits 34a of the reflecting plate 34, too. The slits 34a of the reflecting plate 34 have a width of about 5 mm, for example. The openings 36a of the photomask 36 have a width of about 20 μm, for example, and are disposed in the pitch of 200 μm. The gap between the condensing means 40 and the reflecting plate 34 is 2 cm, the gap between the reflecting plate 34 and the photomask is 1 cm, and the gap between the photomask 36 and the alignment layer 18 (20) is 100 μm. A liquid crystal display panel is fabricated in the same way as in the foregoing example.

Figure 13:
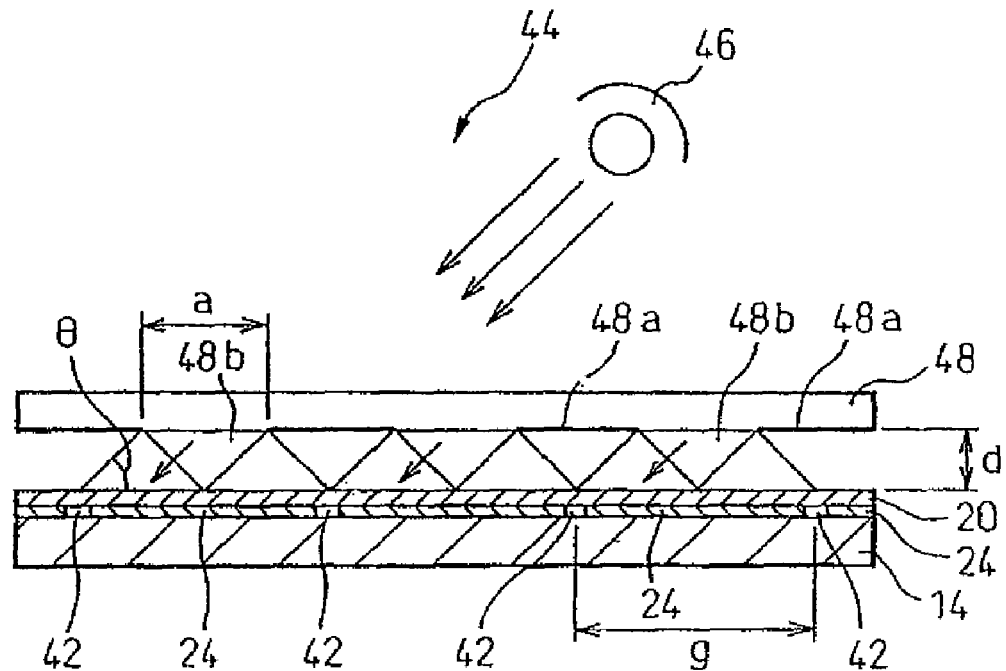
FIG. 13 is a view showing the first exposure step of an exposing method of an alignment layer according to the third embodiment of the present invention.
Figure 14:
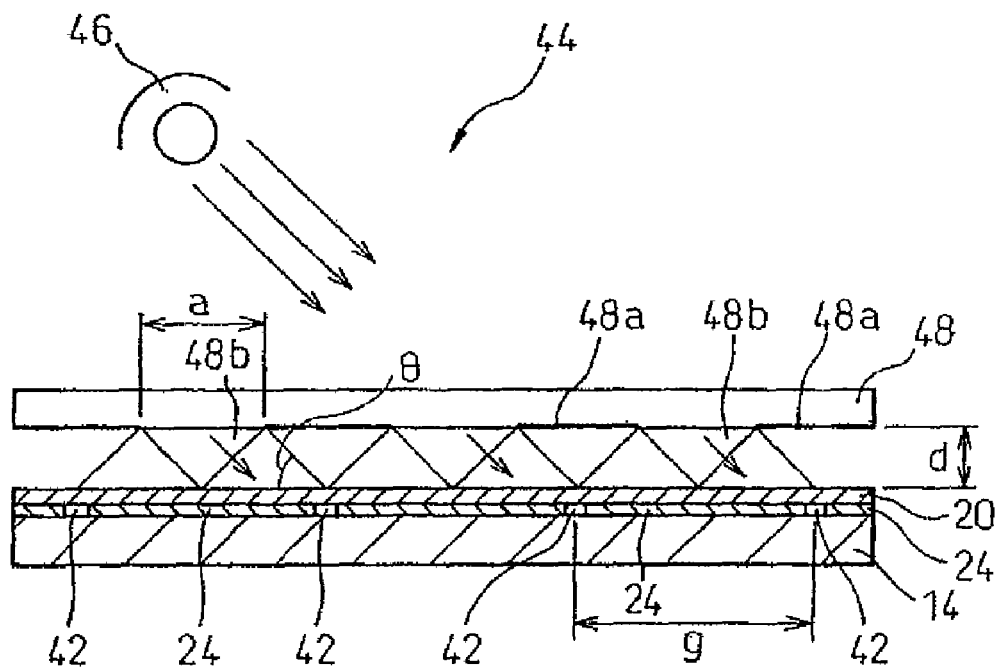
FIG. 14 is a view showing the second exposure step after the first exposure step shown in FIG. 13.

FIG. 13 shows the first exposure step of an exposing method of an alignment layer according to the third embodiment of the present invention. FIG. 14 shows the second exposure step subsequent to the step shown in FIG. 13. A substrate 14 is a TFT substrate in the same way as the substrate 14 of the liquid crystal display device shown in FIG. 1. The substrate 14 has pixel electrodes 24 and an alignment layer 20.

Each pixel electrode 24 is surrounded by gate bus lines 42 and data bus lines. FIGS. 13 and 14 are sectional views crossing the gate bus lines 42. Each pixel electrode 24 has an elongated shape extending in parallel to the data bus lines, and the gate bus lines 42 and the data bus lines define a pixel region of 200 μm×70 μm. The gate bus lines 42 and the data bus lines have a width of 5 μm and are formed in a spaced apart relationship from the pixel electrode 24 by 3 μm. The opposing substrate 12 has a black matrix, the common electrode 22 and the alignment layer 18 (see FIG. 1). The black matrix defines a pixel region of 200 μm×70 μm. Two gate bus lines 42 determine the pixel pitch g. Similarly, the pixel pitch g is determined in the opposing substrate 12, too.

The exposure apparatus 44 includes a UV light source 46 emitting parallel ultraviolet light and a photomask 48. The photomask 48 includes shading members 48a (e.g. metallic chromium) deposited on the surface of a transparent plate (e.g. quartz). The shading members 48a form openings 48b. The size of the openings 48b of the photomask 48 is "a" (μm).

The photomask 48 is disposed above the alignment layer 20, and the gap between the photomask 48 (the surface of its shading member 48) and the alignment layer 20 is "d" (μm). The photomask 48 is positioned with respect to the alignment layer 20 in such a fashion that the center of one opening 48b of the photomask 48 is aligned with the center of one pixel region (the center between the two gate bus lines 42) of the alignment layer 20.

The UV light source 46 is obliquely disposed above the photomask 48. The UV light source 46 is disposed in such a fashion that the angle of the ultraviolet light made incident to the photomask 48 and to the alignment layer 2 is θ (rad). The UV light source 46 is first disposed obliquely above the photomask 48 at the angle θ to conduct the first exposure, as shown in FIG. 13, and is then disposed obliquely and symmetrically to the UV light source 46 of the first arrangement at the angle θ to conduct the second exposure, as shown in FIG. 14.

The size "a" (μm) of the opening 48b is preferably about a half of the pixel pitch "g" (μm). For example, the size "a" of the opening 48b is 100 μm, and the pixel pitch "g" is 200 μm. With this construction, it becomes possible to position the photomask 48 with respect to the alignment layer 20 and to conduct the first exposure as shown in FIG. 13, and to irradiate the ultraviolet light onto the half of each pixel region of the alignment layer 20. It is also possible to conduct the second exposure while the relationship between the photomask 48 and the alignment layer 20 is kept as such (without conducting positioning again), and to irradiate the remaining half of each pixel region of the alignment layer 20, as shown in FIG. 14. In other words, the troublesome positioning work between the photomask 48 and the alignment layer 20 needs to be carried out only once, and exposure can be conducted twice from different angles.

Figure 15:
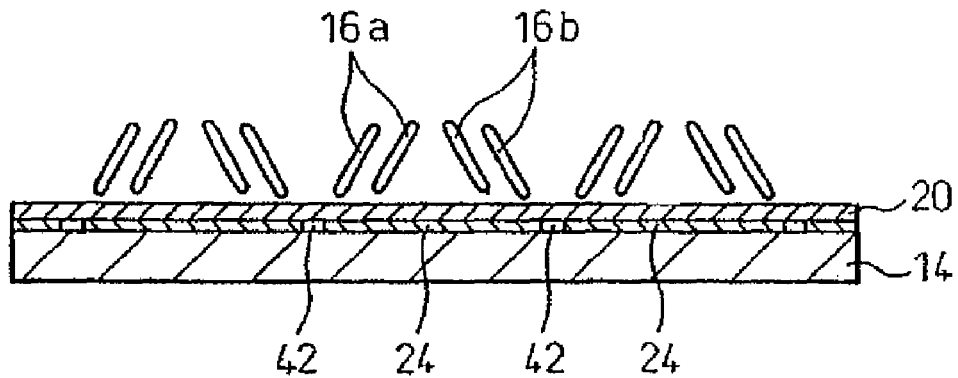
FIG. 15 is a view showing the substrate having the alignment layer treated by the exposing method shown in FIGS. 13 and 14.

FIG. 15 shows the substrate 14 having the alignment layer 20 that is treated by the exposing method shown in FIGS. 13 and 14. The molecules 16a of the liquid crystal 16 in one region and the molecules 16b of the liquid crystal 16 of another region are aligned in mutually opposite directions. In this way, the liquid crystal display device having alignment division can be easily fabricated.

Figure 16:
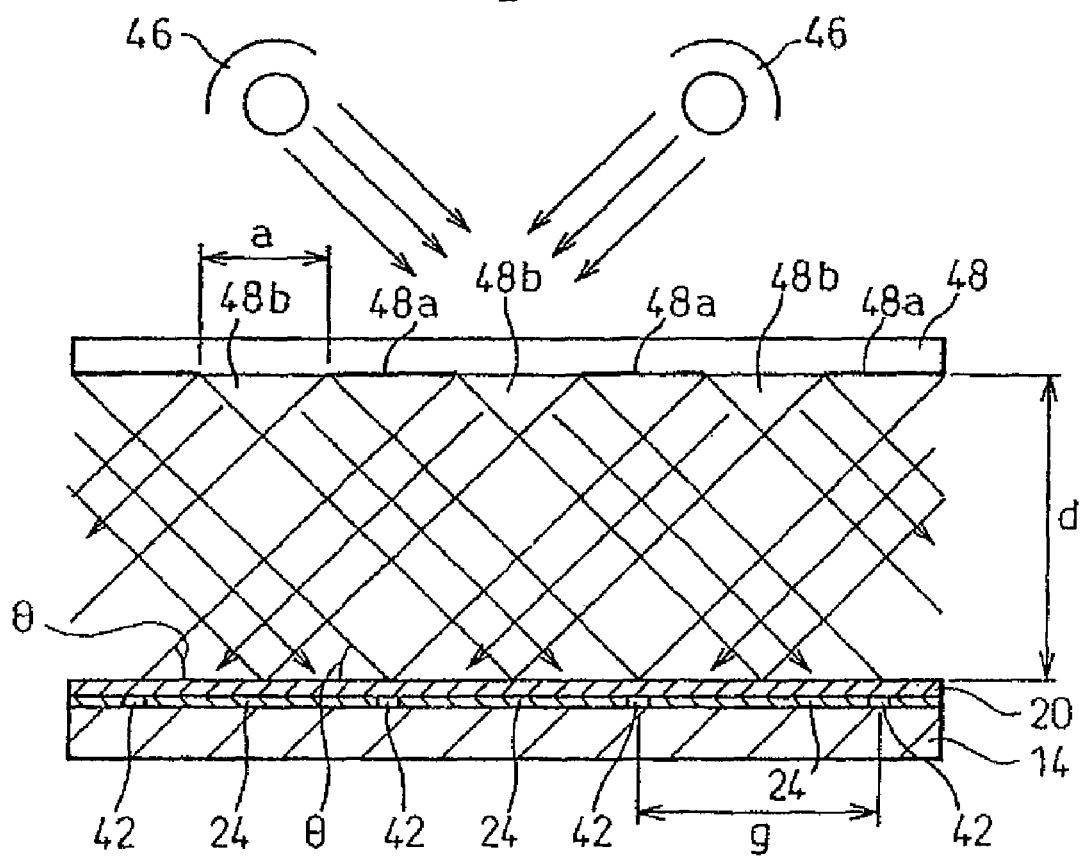
FIG. 16 is a view showing a modified example of the treating method of the alignment layer shown in FIGS. 13 and 14.

FIG. 16 shows a modified example of the treating method of the alignment layer shown in FIGS. 13 and 14. In FIG. 16, the exposure apparatus 44 includes the UV light source 46 emitting parallel ultraviolet light and the photomask 48. The pixel pitch is "g" (μm) and the size of the opening 48b is "a" (μm). The photomask 48 is disposed above the alignment layer 20, and the gap between the photomask 48 (the surface of its shading member 48) and the alignment layer 20 is "d" (μm). The UV light source 46 is obliquely disposed above the photomask 48. The UV light source 46 is disposed in such a fashion that the angle of the ultraviolet light made incident to the photomask 48 and to the alignment layer 2 is θ (rad).

The photomask 48 is disposed above the alignment layer 20, and the gap between the photomask 48 and the alignment layer 20 is "d" (μm). The photomask 48 is positioned with respect to the alignment layer 20 in such a fashion that the center of one opening 48b of the photomask 48 is aligned with the center of one pixel region (the center between the two gate bus lines 42) of the alignment layer 20. The UV light source 46 shown in FIG. 16 is first disposed obliquely above the photomask 48 at the angle θ to conduct the first exposure and is then disposed obliquely and symmetrically to the UV light source 46 of the first disposition at the angle θ and conducts the second exposure. In this way, the treating method of the alignment layer shown in FIG. 16 can limit the troublesome positioning work between the photomask 48 and the alignment layer 20 to only once, and can conduct the exposure twice from different angles.

In the basic feature of the third embodiment, the UV light source 46, the photomask 48 and the alignment layer 20 are arranged in such a fashion that the ultraviolet light passing through one opening 48b of the photomask 48 impinges upon the pixel region that is displaced from the pixel region of the alignment layer 20 aligned with this one opening 48b (existing immediately below this one opening 48b) by n pixel regions (where n is an integer equal to more than 0).

In FIG. 16, the arrangement is such that the ultraviolet light passing through one opening 48b of the photomask 48 impinges upon the pixel region displaced from the pixel region of the alignment layer 20 aligned with this one opening 48b (existing immediately below this one opening 48b) by one pixel region (adjacent pixel region). Incidentally, the examples shown in FIGS. 13 and 14 correspond to the case where n is 0.

The UV light source 48, the photomask 48 and the alignment layer 20 are so arranged as to satisfy the following relationships.

$$(g/2 - 20) \leq a \leq (g/2 + 20) \quad (1)$$

$$\frac{2d}{(4n+1)\tan\theta} - 20 \leq a \leq \frac{2d}{(4n+1)\tan\theta} + 20 \quad (2)$$

After positioning is made in this way, the ultraviolet light is irradiated from the UV light source 46 to conduct the alignment treatment of the alignment layer 20.

The gap "d" (μm) between the photomask 48 and the alignment layer 20 satisfies the following relationship.

$$\frac{(4n+1)(a-20)\tan\theta}{2} \leq d \leq \frac{(4n+1)(a+20)\tan\theta}{2} \quad (3)$$

The angle θ (rad) of the ultraviolet light made incident to the alignment layer 20 satisfies the following relationship.

$$\arctan\frac{2d}{(4n+1)(a+20)} \leq \theta \leq \arctan\frac{2d}{(4n+1)(a-20)} \quad (4)$$

FIG. 17 shows the width of the non-exposed region and the alignment state in the liquid crystal display device with the alignment division established by exposing twice one pixel region. FIG. 18 shows the width of the overlapping exposed region and the alignment state in the liquid crystal display device with the alignment division established by exposing twice one pixel region. The non-exposed region and the overlapping exposed region will be explained with reference to FIGS. 19 and 20. If the regions exposed by the first and second exposure steps are distributed exactly to both sides of the centerline of one pixel region, the non-exposed region and the overlapped exposed region do not develop. In practice, however, the situation is not so ideal. If the non-exposed region and the overlapping exposed region are small, they do not affect the alignment state. If the non-exposed region and the overlapping exposed region are large, they do affect the alignment state.

FIG. 17 shows that, if the width of the non-exposed region is not greater than 20 μm, the excellent alignment state can be maintained. FIG. 18 shows that, if the width of the overlapping exposed region is not greater than 20 μm, the excellent alignment state can be maintained. The formulas (1) and (2) given above are based on the examination results shown in FIGS. 17 and 18.

Figure 19A:
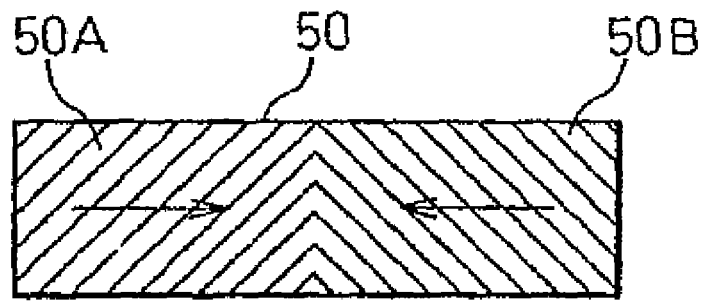
FIGS. 19A to 19C are views showing examples of the exposure state of one pixel region when the size of the opening of the photomask is changed.
Figure 19B:
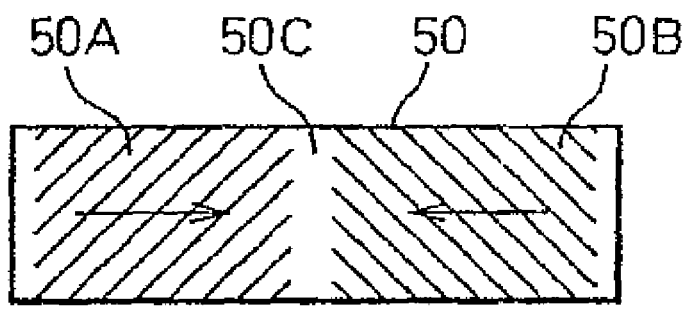
Figure 19C:
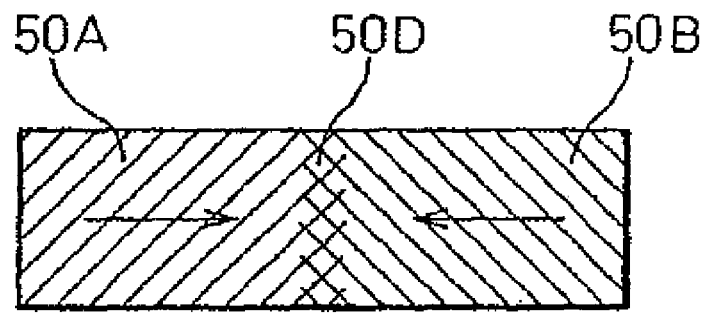

FIGS. 19A to 19C show the exposure state of one pixel region when the size "a" (μm) of the opening 48b of the photomask 48 is changed. Reference numeral 50 denotes one pixel region. Reference numeral 50A denotes the region exposed by the second exposure step. Reference numeral 50B denotes the region exposed by the first exposure step. An arrow represents the pre-tilt direction. FIG. 19A shows the case where the size "a" (μm) of the opening 48b is set so that the regions 50A and 50B exposed by the first and second exposure steps are distributed exactly to both sides of the centerline of one pixel region. In this case, the non-exposed region and the overlapping exposed region do not exist.

FIG. 19B shows the case where the size "a" (μm) of the opening 48b is set to a value smaller than that in the case of FIG. 19A. In this case, since both exposed regions 50A and 50B become narrower, the non-exposed region 50C develops. FIG. 19C shows the case where the size "a" (μm) of the opening 48b is set to a value greater than that in the case of FIG. 19A. In this case, as both exposed regions 50A and 50B become broader, the overlapping exposed region 50D develops.

Figure 20A:
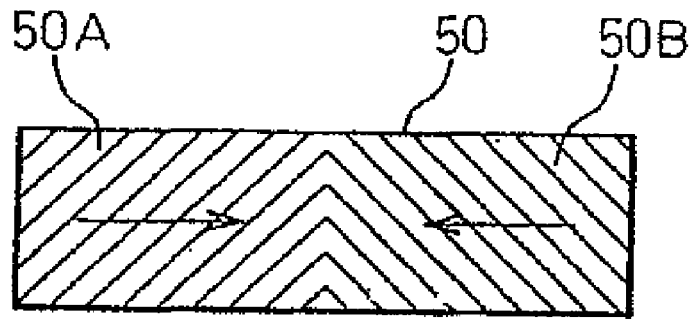
FIGS. 20A to 20C are views showing examples of the exposure state of one pixel region when a gap between the photomask and the alignment layer is changed.
Figure 20B:
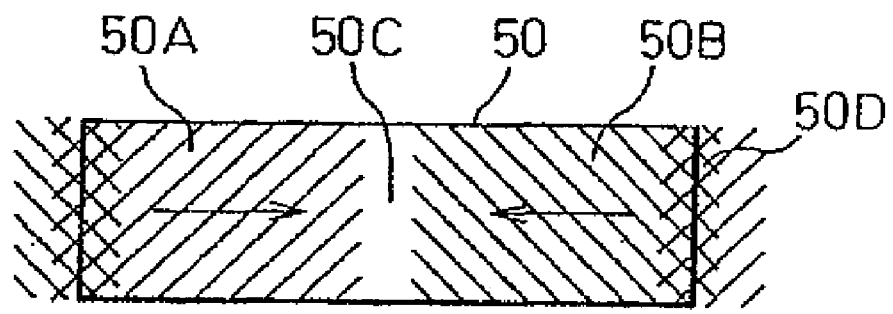
Figure 20C:
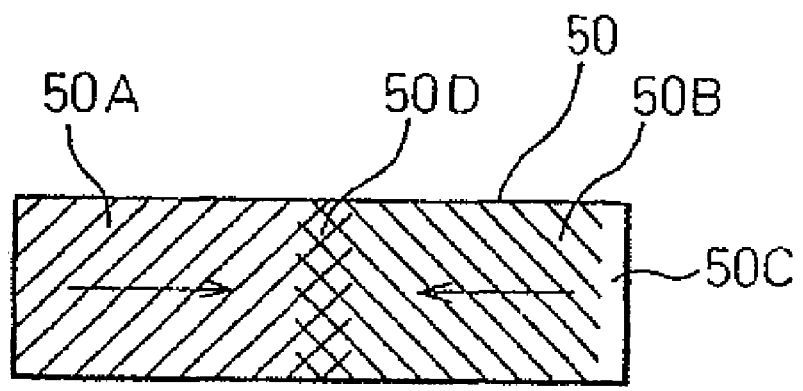

FIGS. 20A to 20C show the exposure state of one pixel region when the gap "d" (μm) between the photomask 48 and the alignment layer 20 is changed. FIG. 20A represents the case where the gap "d" is set so that the exposed regions 50A and 50B exposed by the first and second exposure steps are distributed exactly on either side of the centerline of one pixel region. In this case, the non-exposed region and the overlapping exposed region do not exist.

FIG. 20B represents the case where the gap "d" is set to a value smaller than that in the case of FIG. 20A. In this case, since the exposed regions 50A and 50B deviate outward, the non-exposed region 50C develops at the center of the pixel and the overlapping exposed region 50D develops at the end of the pixel. FIG. 20C represents the case where the gap "d" is set to a value greater than that in the case of FIG. 20A. In this case, since the exposed regions 50A and 50B deviate towards the center, the overlapping exposed region 50D develops at the center of the pixel and the non-exposed region 50C develops at the end of the pixel.

Figure 21A:
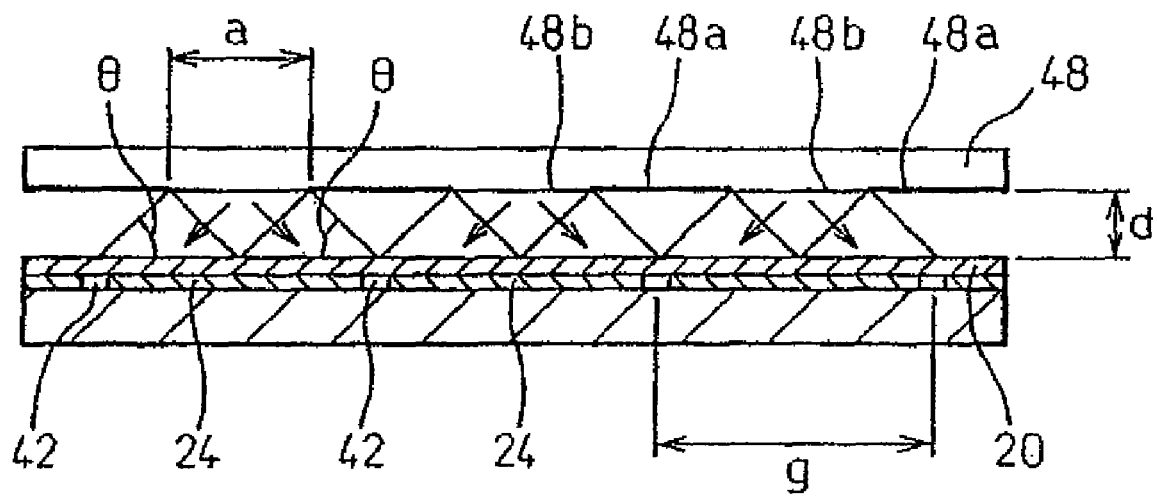
FIGS. 21A and 21B are views explaining problems when the pixel pitch is changed.
Figure 21B:
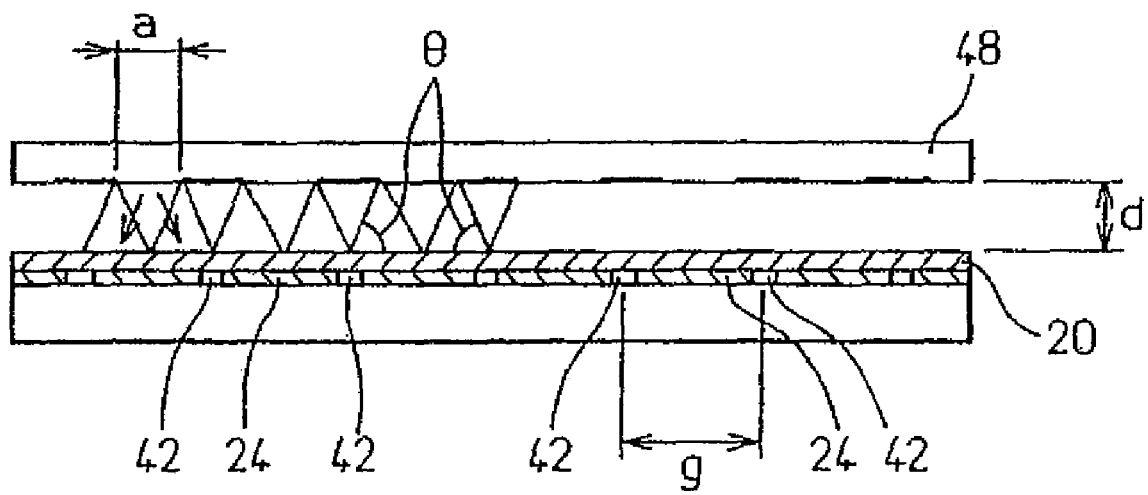

FIGS. 21A and 21B are views explaining the problem when the pixel pitch "g" (μm) is changed. In the proximity exposure, positioning between the photomask 48 and the alignment layer 20 is conducted while the gap "d" is secured between them. As the pixel becomes smaller, however, the gap "d" between the photomask 48 and the alignment layer 20 must be decreased, but the gap "d" cannot be decreased below an allowable value.

FIG. 21A shows the case where the pixel pitch "g" is sufficiently great and the gap "d" between the photomask 48 and the alignment layer 20 falls within the allowable range. FIG. 21B shows the case where the pixel pitch "g" becomes smaller and the gap "d" must assume a value smaller than the allowable range. In practice, however, the gap "d" cannot take a value smaller than the allowable range. In order to conduct two exposure steps by a single positioning step, therefore, it is necessary to keep the gap "d" within the allowable range and to change the angle θ of the ultraviolet light made incident to the alignment layer. However, when the angle θ of the ultraviolet light made incident to the alignment layer 20 is changed, the alignment treatment capability by the ultraviolet light drops undesirably.

It is advisable in such a case to employ the construction wherein the ultraviolet light passing through one opening 48b of the photomask 48 irradiates the pixel region that is displaced from the pixel region of the alignment layer 20 aligned with this one opening 48b (existing immediately below this one opening 48b), by n pixel regions (where n is an integer equal to or more than 0), as explained with reference to FIG. 16. According to this construction, it is possible to keep the gap "d" within the allowable range and to set the angle θ of the ultraviolet light made incident to the alignment layer 20 to a suitable value. The third embodiment can exploit this advantage.

Figure 22:
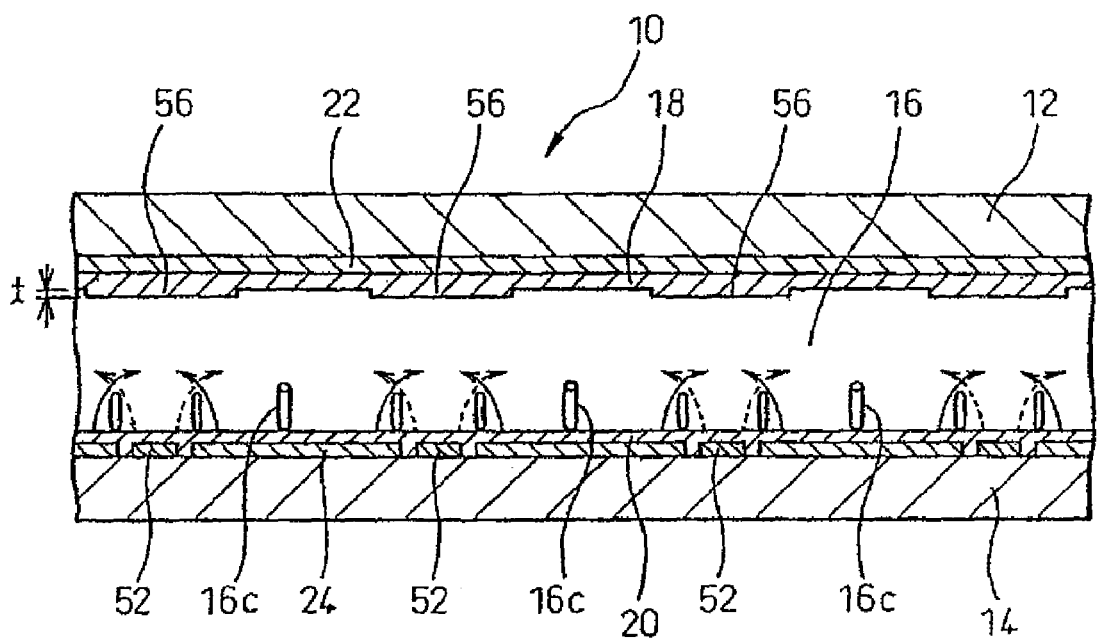
FIG. 22 is a view showing a liquid crystal display device according to the fourth embodiment of the present invention.

FIG. 22 shows a liquid crystal display device according to the fourth embodiment of the present invention. The liquid crystal display device 10 includes a pair of transparent substrates 12 and 14, a liquid crystal 16 arranged between the pair of substrates 12 and 14, and alignment layers 18 and 20 respectively provided on the inner surface side of the substrates 12 and 14. Electrodes 22 and 24 are disposed under the alignment layers 18 and 20, respectively. One of the substrates 12 is a color filter substrate, and the electrode 22 is a common electrode. The other substrate 14 is a TFT substrate, and the electrode 24 includes a plurality of pixel electrodes disposed with an active matrix including TFTs.

Figure 24:
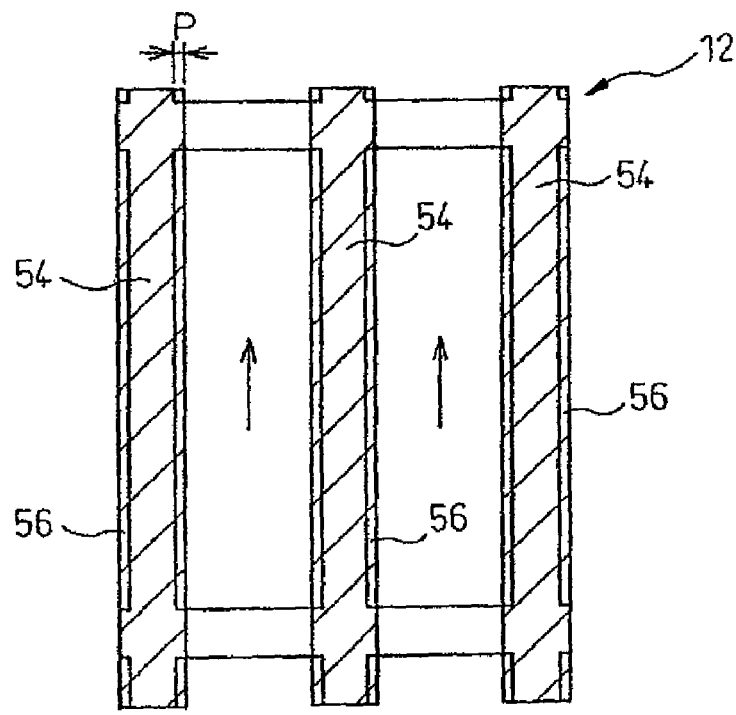
FIG. 24 is a plan view showing the color filter substrate shown in FIG. 22.
Figure 25:
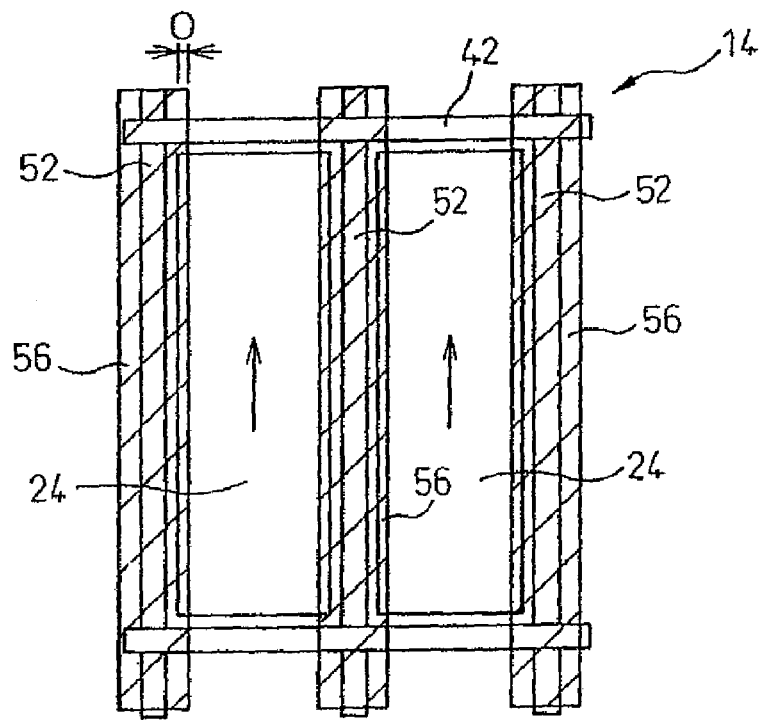
FIG. 25 is a plan view showing the TFT substrate, with the bank structures of the color filter substrate shown additionally.

FIG. 24 is a plan view showing the inner surface of the color filter substrate 12 shown in FIG. 22. The color filter substrate 12 has a black matrix 54. FIG. 25 is a plan view showing the inner surface of the TFT substrate 14, and bank structures of the color filter substrate 12 are additionally illustrated in FIG. 25. Gate bus lines 42 and data bus lines 52 surround the pixel electrode 24. The data bus lines 52 can be seen in FIG. 22.

The liquid crystal 16 has negative dielectric anisotropy. The alignment layers 18 and 20 are vertical alignment layers. The alignment layers 18 and 20 are subjected to the alignment treatment so that the liquid crystal molecules 16c are aligned in the a direction perpendicular to the sheet of FIG. 22. In FIGS. 24 and 25, arrows represent the alignment direction (pre-tilt direction) of the liquid crystal. The alignment treatment can be conducted by using various means. For example, the alignment treatment can be conducted by rubbing or UV irradiation as explained.

Figure 23:
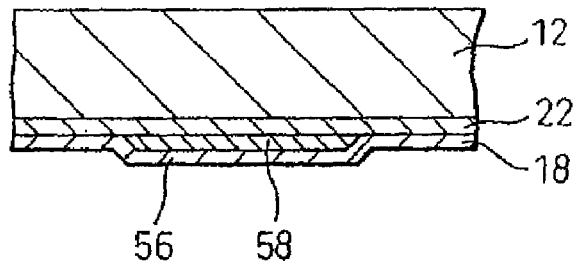
FIG. 23 is an enlarged view showing a part of the color filter substrate shown in FIG. 22.

FIG. 23 is an enlarged view showing a part of the color filter substrate 12 shown in FIG. 22. In FIGS. 22 and 23, bank structures 56 are disposed on the alignment layer 18 of the color filter substrate 12 at positions corresponding to the data bus lines 52 of the TFT substrate 14. A dielectric film 58 is formed in a predetermined shape on the common electrode 22. The bank structure 56 is formed as a projection of the alignment layer 18 covering the dielectric film 58. The dielectric film 58 is extremely thin. When a resist pattern is used to form the dielectric film 58, for example, the resist pattern is made thin by conducting ozone ashing. Alternatively, the resist is in advance diluted by a diluent and the solution is spin-coated. The resist pattern can be made thin when the diluent is expelled. In the present invention, the thickness "t" of the bank structures 56 is within the range of 0.1 to 0.15 µm.

As can be seen in FIGS. 22 to 25, the bank structures 56 are arranged immediately above the data bus lines 52 and extend in parallel to the data bus lines 52. The width of the bank structures 56 is greater than that of the data bus lines 52. Therefore, the bank structures 56 not only cover the data bus lines 52 but also overlap with the ends of the pixel electrodes 24. Symbol "O" represents the overlapping quantity of the bank structure 56 with the pixel electrode 24, and symbol "P" represents the swelling quantity of the bank structure 56 from the black matrix 54.

Figure 26:
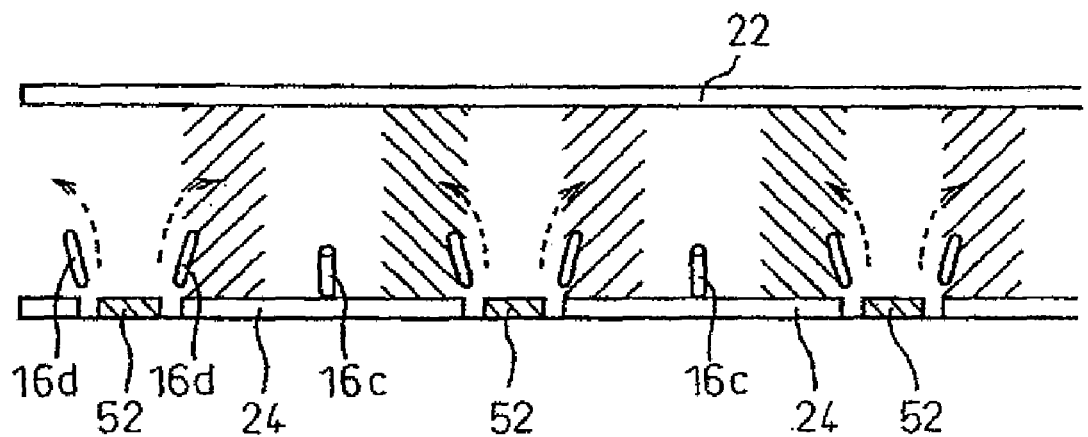
FIG. 26 is a view showing an example of a liquid crystal display device for explaining that a transverse electric field disturbs the alignment of the liquid crystal at a boundary portion between the pixel electrode and the bus line.

FIG. 26 shows an example of the liquid crystal display device to explain disturbance of the alignment of the liquid crystal due to a transverse electric field at the boundary portion between the pixel electrode and the bus line. The alignment layers 18 and 20 are omitted from FIG. 26. The liquid crystal molecules 16c are aligned in the direction perpendicular to the sheet of FIG. 26. However, the liquid crystal molecules 16d positioned at the boundary portion between the pixel electrode 24 and the data bus line 52 receive the effect of the transverse electric field between the pixel electrode 24 and the data bus line 52, and are tilted toward the direction parallel to the sheet of FIG. 26 (in the direction from the edge portion of the pixel electrode 24 towards the center thereof), as represented by broken lines with arrows. Consequently, the alignment of the liquid crystal is disturbed at the boundary portion between the pixel electrode 24 and the data bus line 52, and disclination may occur, as represented by hatching. For example, the transmission drops at this portion when white is displayed, and the brightness also drops.

Figure 27:
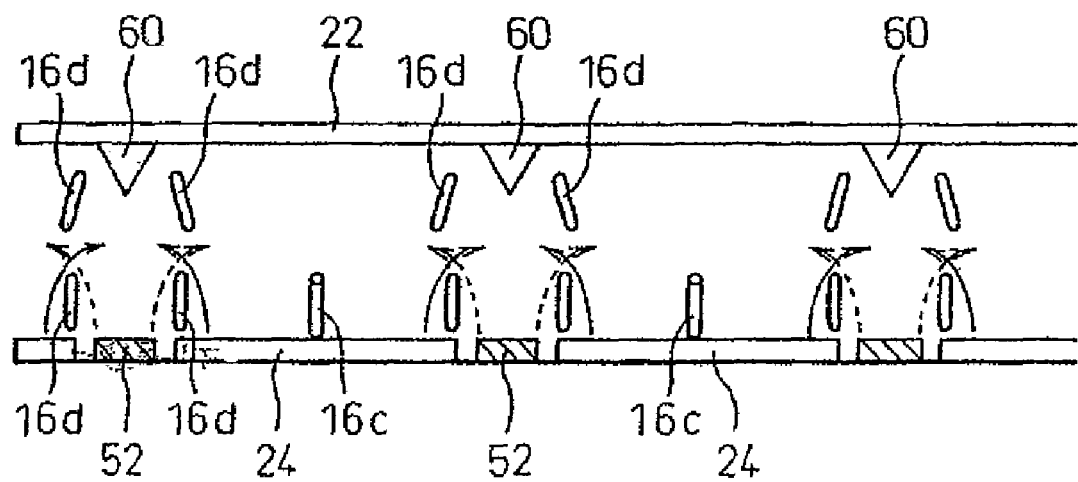
FIG. 27 is a view showing a basic example for preventing the disturbance of the alignment of the liquid crystal.

FIG. 27 shows a basic example for preventing the disturbance of the alignment of the liquid crystal. The bank structures 60 having a certain thickness are disposed immediately above the data bus line 52s in parallel to the data bus lines 52. The liquid crystal molecules 16d in the proximity of the bank structures 60 are aligned perpendicular to the surface of the bank structures 60. The alignment direction of the liquid crystal molecules 60 in the proximity of the bank structure 60 is in reverse to the alignment direction of the liquid crystal molecules 16d that are positioned at the boundary portion between the pixel electrode 24 and the data bus line 52 and that receives the effect of the transverse electric field, and the alignment tendencies in two directions are offset from one another, whereby the liquid crystal molecules are prevented from tilting in a direction parallel to the sheet of FIG. 27 (in a direction from the edge towards the center of the pixel electrode 24). Consequently, the occurrence of disclination can be suppressed.

However, the bank structures 60 are disposed on the color filter substrate 12, and a positioning error at the time of joining the color filter substrate 12 and the TFT substrate 14 must be taken into consideration. Also, the overlapping quantity between the bank structure 60 and the edge of the pixel electrode 24 poses another problem. When the overlapping quantity is small, the alignment controlling force of the bank structure 60 becomes small, and fails to suppress the occurrence of disclination resulting from the transverse electric field. When the overlapping quantity is great, on the contrary, the alignment controlling force of the bank structure 60 becomes great, and disclination resulting from the bank structure occurs.

As a result of study of the relationship between the overlapping quantity of the bank structure with the edge of the pixel electrode 24 and disclination, it is found that the overlapping quantity of the bank structure 60 with the edge of the pixel electrode 24 that can most greatly reduce disclination changes depending on the thickness "t" of the bank structure 60. The greater the thickness "t" of the bank structure 60, the smaller becomes the overlapping quantity that can reduce disclination, and the smaller the thickness "t" of the bank structure 60, the greater becomes the overlapping quantity that can reduce disclination.

To reduce the occurrence of disclination resulting from the positioning error, it is preferred to reduce the thickness of the bank structures as much as possible. In the present invention, the thickness "t" the bank structure 56 is in the range of 0.1 to 0.15 µm. In this case, the overlapping quantity between the bank structure 56 and the edge of the pixel electrode 24, that can reduce disclination, is preferably in the range from 2 to 8 µm.

In the embodiment, the pixel pitch in the direction of the gate bus lines 42 is 80 µm, the width of the data bus lines 52 is 5 µm, the gap between the pixel electrode 24 and the data bus line 52 is 3 µm, and the width of the pixel electrode 24 is 69 µm. The width of the black matrix 54 is 11 µm and the pitch of the black matrix 54 is 80 µm. The thickness of the bank structures 56 is 0.12 µm and the width of the bank structures 56 is 21 µm. Therefore, the overlapping quantity "O" of the bank structure 56 and the pixel electrode 24 is 5 µm and the swelling quantity of the bank structure 56 from the black material 54 is 5 µm.

Joining of the color filter substrate 12 and the TFT substrate 14 is conducted in such a fashion that the edge of the black matrix 54 is aligned with the edge of the pixel electrode 24. Joining is conducted also in such a fashion that the pretilt direction of the alignment layer 18 of the color filter substrate 12 is reverse to the pretilt direction of the alignment layer 20 of the TFT substrate 14. When the color filter substrate 12 and the TFT substrate 14 are joined to each other, a positioning margin of ±3 μm must be taken into consideration. When the overlapping quantity "O" of the bank structure 56 with the pixel electrode 24 is 5 μm, the overlapping quantity "O" falls within the range from 2 to 8 μm even when any positioning error occurs. When the overlapping quantity "O" is within this range, the occurrence of disclination can be suppressed.

Figure 28:
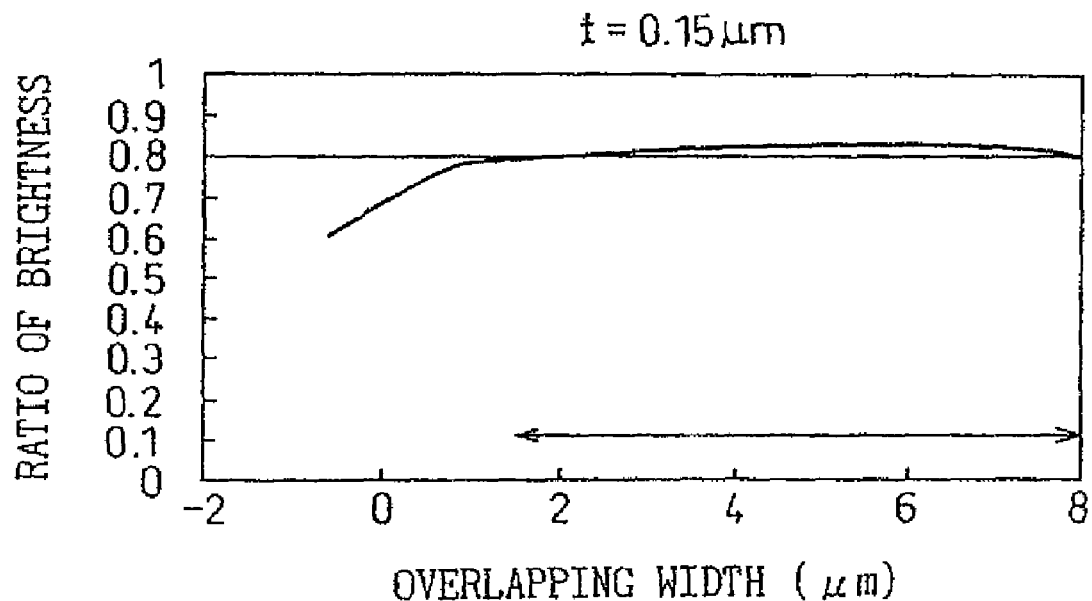
FIG. 28 is a view showing the relationship between the overlap of the bank structure with the pixel electrode and the ratio of brightness.

FIG. 28 shows the relationship between the overlapping quantity (width) "O" of the bank structure 56 with the pixel electrode 24 and the brightness ratio when the thickness of the bank structures 56 is 0.15 μm. The brightness ratio is represented by the brightness at the end portion of the pixel electrode 24 when the brightness at the center portion of the pixel electrode 24 is 1. The drop of the brightness remains within 20% when the overlapping quantity "O" is within the range from 2 to 8 μm. The drop of the brightness is small even when the overlap "O" is outside the range from 2 to 8 μm.

Figure 29:
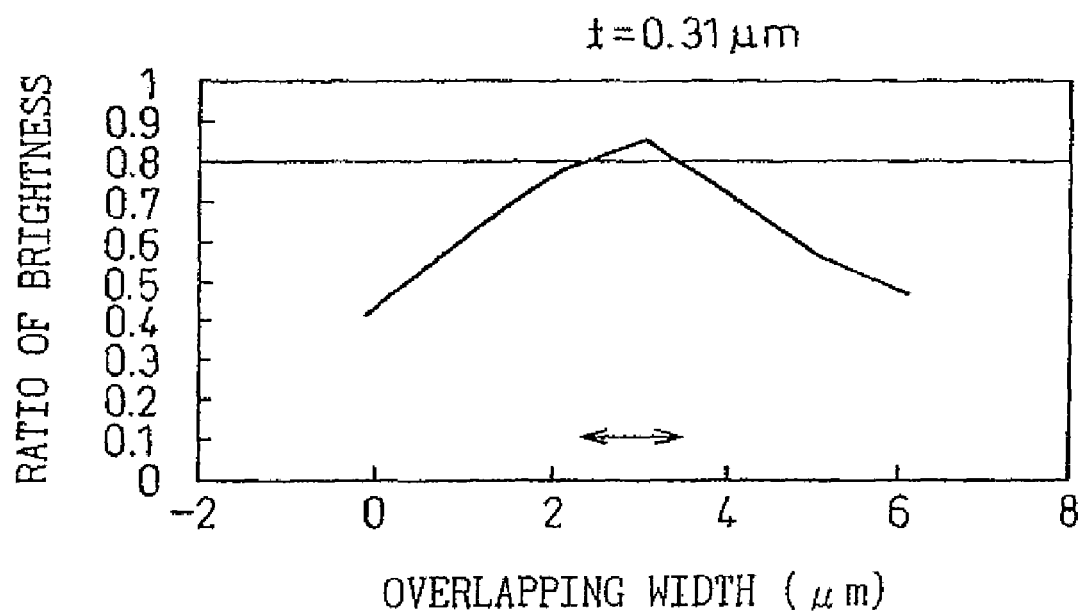
FIG. 29 is a view showing the relationship between the overlap of the bank structure with the pixel electrode and the ratio of brightness.

FIG. 29 shows the relationship between the overlapping quantity (width) "O" of the bank structure 56 with the pixel electrode 24 and the brightness ratio when the thickness of the bank structures 56 is 0.31 μm. The drop of the brightness remains within 20% when the overlapping quantity "O" is within a small range around 3 μm as the center. When the overlapping quantity "O" is outside this range, the brightness drops drastically.

FIG. 30 shows the relationship between the overlapping quantity "O" of the bank structure 56 with the pixel electrode 24 and the brightness ratio when the thickness of the bank structure 56 is 1.75 μm. The drop of the brightness remains within 20% when the overlapping quantity "O" is in the range from −1 to +3 μm. When the overlapping quantity "O" is outside this range, the brightness drops drastically. Incidentally, the overlapping quantity "O" of −1 μm represents that there is a distance between the bank structure 56 and the pixel electrode 24.

As explained above, the present invention can accomplish stable alignment of the liquid crystal and can therefore obtain a liquid crystal display device capable of providing an excellent display.

The invention claimed is:

1. A method of treating an alignment layer, on which a plurality of pixel regions are defined, for conducting an alignment treatment of said alignment layer by irradiating ultraviolet light onto said alignment layer, said method comprising the steps of:
providing said alignment layer, which is formed of polyamic acid and polyimide, said polyamic acid including a first diamine component and said polyimide including a second diamine component which is different from said first diamine component;
disposing a photomask above said alignment layer;
positioning said photomask so that a center portion of a first opening of said photomask is aligned with a center portion of a first pixel region of said alignment layer;
disposing an ultraviolet light source obliquely above said photomask at a first position;
conducting a first exposure by irradiating ultraviolet light from said ultraviolet light source at said first position;
disposing, at a second position, said ultraviolet light source obliquely and symmetrically to said light source at said first position above said photomask; and
conducting a second exposure by irradiating ultraviolet light from said ultraviolet light source at said second position.

2. The method according to claim 1, wherein said photomask includes a plurality of openings and a size of each of said plurality of openings is about a half of a pixel pitch.

3. A liquid crystal display device fabricated by said method according to claim 1.

4. A method of treating an alignment layer, on which a plurality of pixel regions are defined, for conducting an alignment treatment of said alignment layer by irradiating ultraviolet light onto said alignment layer, said method comprising the steps of:
providing said alignment layer, which is formed of polyamic acid and polyimide including diamine components, said diamine components include a diamine component realizing a vertical alignment property of a liquid crystal and a diamine component which does not realize a vertical alignment property of a liquid crystal;
disposing an photomask above said alignment layer;
positioning said photomask so that a center portion of a first opening of said photomask is aligned with a center portion of a first pixel region of said alignment layer;
disposing a ultraviolet light source obliquely above said photomask at a first position;
conducting a first exposure by irradiating ultraviolet light from said ultraviolet light source at said first position;
disposing, at a second position, said ultraviolet light source obliquely and symmetrically to said light source at said first position above said photomask; and
conducting a second exposure by irradiating ultraviolet light from said ultraviolet light source at said second position.

5. The method according to claim 4, wherein said photomask includes a plurality of openings and a size of each of said plurality of openings is about half of a pixel pitch.

6. A liquid crystal display device fabricated by said method according to claim 4.

* * * * *